United States Patent
Yang et al.

(10) Patent No.: US 12,374,668 B2
(45) Date of Patent: Jul. 29, 2025

(54) TILED DISPLAY

(71) Applicant: Samsung Display Co., LTD., Yongin-si (KR)

(72) Inventors: Yong Hoon Yang, Hwaseong-si (KR); Young Jun Kim, Hwaseong-si (KR); Hyun Young Jung, Hwaseong-si (KR); Seon Hwa Choi, Seongnam-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 550 days.

(21) Appl. No.: 17/573,619

(22) Filed: Jan. 11, 2022

(65) Prior Publication Data

US 2022/0223573 A1 Jul. 14, 2022

(30) Foreign Application Priority Data

Jan. 12, 2021 (KR) .................. 10-2021-0003714

(51) Int. Cl.
| | |
|---|---|
| *H01L 25/13* | (2006.01) |
| *H10H 20/01* | (2025.01) |
| *H10H 20/821* | (2025.01) |
| *H10H 20/84* | (2025.01) |
| *H10H 20/852* | (2025.01) |

(Continued)

(52) U.S. Cl.
CPC ............. *H01L 25/13* (2013.01); *H10H 20/01* (2025.01); *H10H 20/821* (2025.01); *H10H 20/84* (2025.01); *H10H 20/852* (2025.01); *H10H 20/857* (2025.01); *H10H 29/142* (2025.01);

(Continued)

(58) Field of Classification Search
CPC ..... H01L 25/13; H01L 27/156; H01L 33/005; H01L 33/24; H01L 33/44; H01L 33/52; H01L 33/62; H01L 2933/005; H01L 2933/0066; H01L 25/0753; H01L 25/167; H01L 27/124; H01L 33/08; H01L 33/20; H01L 27/1214; G09G 2300/026; G09G 3/3208; G09G 3/36; G02F 1/13452; G02F 1/13336; G09F 9/33; G09F 9/3023; H10K 59/18

See application file for complete search history.

(56) References Cited

U.S. PATENT DOCUMENTS 10,332,859 B2 * 6/2019 Nakamura ............. H10K 59/35
2004/0256977 A1 * 12/2004 Aston .................... H10K 59/18
313/498

(Continued)

FOREIGN PATENT DOCUMENTS

CN 107871771 A * 4/2018 ......... G02F 1/13336
KR 1020060072737 A 6/2006

(Continued)

*Primary Examiner* — Jarrett J Stark
(74) *Attorney, Agent, or Firm* — CANTOR COLBURN LLP

(57) ABSTRACT

A tiled display includes a plurality of display devices, where a display area and a non-display area surrounding the display area are defined in each of the plurality of display devices, and a pad area is defined in the non-display area. The plurality of display devices includes a first display device and a second display device disposed adjacent to the first display device in a first direction, and the pad area of the first display device overlaps the display area of the second display device in a thickness direction.

17 Claims, 24 Drawing Sheets

(51) Int. Cl.
*H10H 20/857* (2025.01)
*H10H 29/14* (2025.01)
(52) U.S. Cl.
CPC ..... *H10H 20/0362* (2025.01); *H10H 20/0364* (2025.01)

(56) References Cited

U.S. PATENT DOCUMENTS

| | | | | |
|---|---|---|---|---|
| 2006/0108915 | A1* | 5/2006 | Cok | H10K 59/18 313/504 |
| 2021/0184076 | A1* | 6/2021 | Kim | H01L 33/325 |
| 2023/0238420 | A1* | 7/2023 | Kim | H01L 33/30 257/63 |
| 2023/0238481 | A1* | 7/2023 | Kim | H01L 27/153 257/79 |
| 2024/0155269 | A1* | 5/2024 | Yoon | G02B 13/0055 |
| 2024/0155891 | A1* | 5/2024 | Choi | H10K 59/131 |

FOREIGN PATENT DOCUMENTS

| | | | |
|---|---|---|---|
| KR | 101080224 B1 | 11/2011 | |
| KR | 1020150111808 A | 10/2015 | |
| KR | 1020190044015 A | 4/2019 | |
| KR | 1020190072196 A | 6/2019 | |
| KR | 1020200064207 A | 6/2020 | |
| WO | WO-2018158660 A1 * | 9/2018 | ............... G09F 9/30 |

* cited by examiner

TILED DISPLAY

This application claims priority to Korean Patent Application No. 10-2021-0003714, filed on Jan. 12, 2021, and all the benefits accruing therefrom under 35 U.S.C. § 119, the content of which in its entirety is herein incorporated by reference.

BACKGROUND

1. Field

The disclosure relates to a tiled display.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions. Display devices may be flat panel display devices such as a liquid-crystal display device, a field emission display device, and an organic light-emitting display device. Among such flat panel display devices, a light-emitting display device includes a light-emitting element that may emit light on its own, so that each of the pixels of the display panel may emit light by themselves. Accordingly, a light-emitting display device may display images without using a backlight unit that supplies light to the display panel.

For a display device having a large screen, a large number of pixels are provided in the display device, and thus the defect rate of light-emitting elements may increase while productivity or reliability may deteriorate. To overcome such issues, a tiled display configured by connecting a plurality of display devices having a relatively small size may be used to provide a large screen. Such a tiled display may include boundaries between the plurality of display devices which are referred to as seams because there are the non-display areas or bezel areas between the plurality of display devices adjacent to each other. When a single image is displayed on the full screen, such boundaries between the display devices result in visible seams, hindering a viewer from getting immersed into the image.

Each of the plurality of display devices typically includes a pad area for receiving a data voltage or a scan signal from an external device. The pad area is formed on the upper surface of the end side of the substrate or on the rear surface of the substrate of each of the display devices.

SUMMARY

In a tiled display device including a plurality of display devices, where a pad area is located on the upper surface of the end side of the substrate of the display devices, the seams between the display devices may become larger. In a tiled display device including a plurality of display devices, where the pad area is formed on the rear surface of the substrate of the display devices, an additional process of forming a hole through the substrate may be used. In such a tiled display device, physical damage may occur on the layers on the substrate during the process of forming the hole.

Embodiments of the disclosure provide a tiled display with reduced seams between a plurality of display devices without using a process of forming a hole.

Embodiments of the disclosure also provide a method of fabricating a tiled display by which seams between a plurality of display devices is reduced without using a process of forming a hole.

According to embodiments of the disclosure, the seams between a plurality of display devices of a tiled display are substantially reduced not to be substantially perceived, and no process of forming a hole is used, which may cause damage to the layers on the substrate.

It

According to an embodiment, a tiled display includes a plurality of display devices, where a display area and a non-display area surrounding the display area are defined in each of the plurality of display devices, and a pad area is defined in the non-display area. In such an embodiment, the plurality of display devices includes a first display device and a second display device disposed adjacent to the first display device in a first direction, and the pad area of the first display device overlaps the display area of the second display device in a thickness direction.

According to an embodiment, a tiled display includes a plurality of display devices, where a display area and a non-display area surrounding the display area are defined in each of the plurality of display devices. In such an embodiment, the plurality of display devices includes a first display device and a second display device located adjacent to the first display device in a first direction, the non-display area is located on one side and an opposite side of each of the plurality of display devices, which are opposite to each other in the first direction, a width of the non-display area located on the one side in the first direction is greater than a width of the non-display area located on the opposite side in the first direction, and the non-display area located on the one side of the first display device in the first direction overlaps the display area of the second display device in a thickness direction. In such an embodiment, the first display device includes a substrate unit disposed across the display area and the non-display area, a display element layer disposed on the substrate unit in the display area, a sealing member disposed across the display area and the non-display area to seal the display element layer, and a conductive pattern disposed on the substrate unit in the non-display area located on the one side in the first direction. In such an embodiment, the substrate unit includes a first substrate and a second substrate disposed between the first substrate and the display element layer, a side surface of the first substrate and a side surface of the second substrate, which are on a same side as each other, are not aligned with each other in the thickness direction, the side surface of the first substrate is inclined with respect to a lower surface of the first substrate, and the side surface of the second substrate is inclined with respect to a lower surface of the second substrate.

According to an embodiment, a method of fabricating a tiled display includes preparing each of a first display device and a second display device. In such an embodiment, the preparing each of the first display device and the second display device includes providing a first substrate and a second substrate on a glass in a way such that a side surface of the first substrate protrudes from a side surface of the second substrate in a first direction, where the side surface of the first substrate and the side surface of the second substrate are on a same side as each other; providing a display element layer on an upper surface of the second substrate, and providing a pad electrode on a part of an upper surface of the first substrate protruding from the second substrate in the first direction; and providing an encapsulation member to encapsulate the display element layer.

BRIEF DESCRIPTION OF THE DRAWINGS

The above and other features of the invention will become more apparent by describing in detail embodiments thereof with reference to the accompanying drawings, in which.

DETAILED DESCRIPTION

Figure 1:
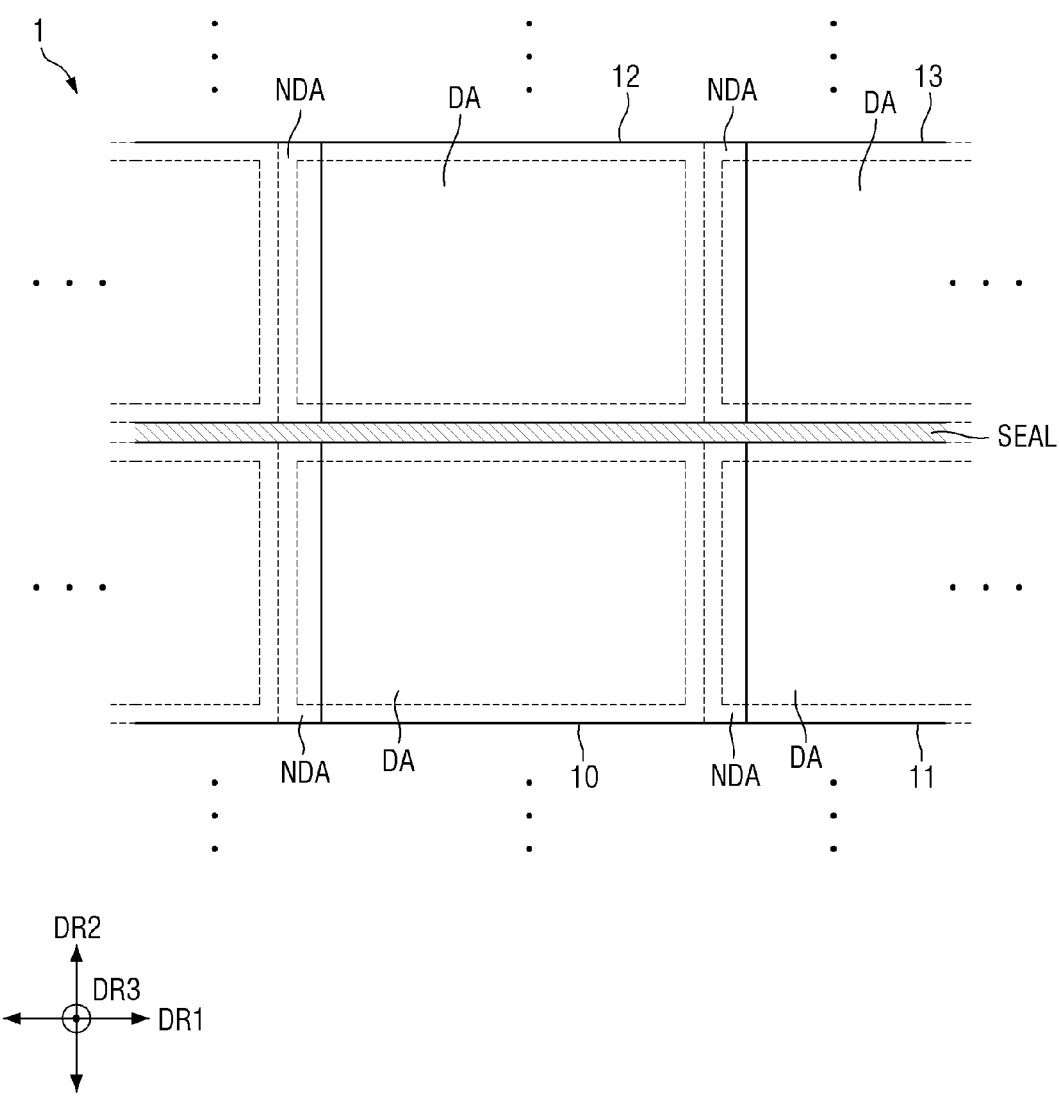
FIG. 1 is a plan view showing a tiled display according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2A:
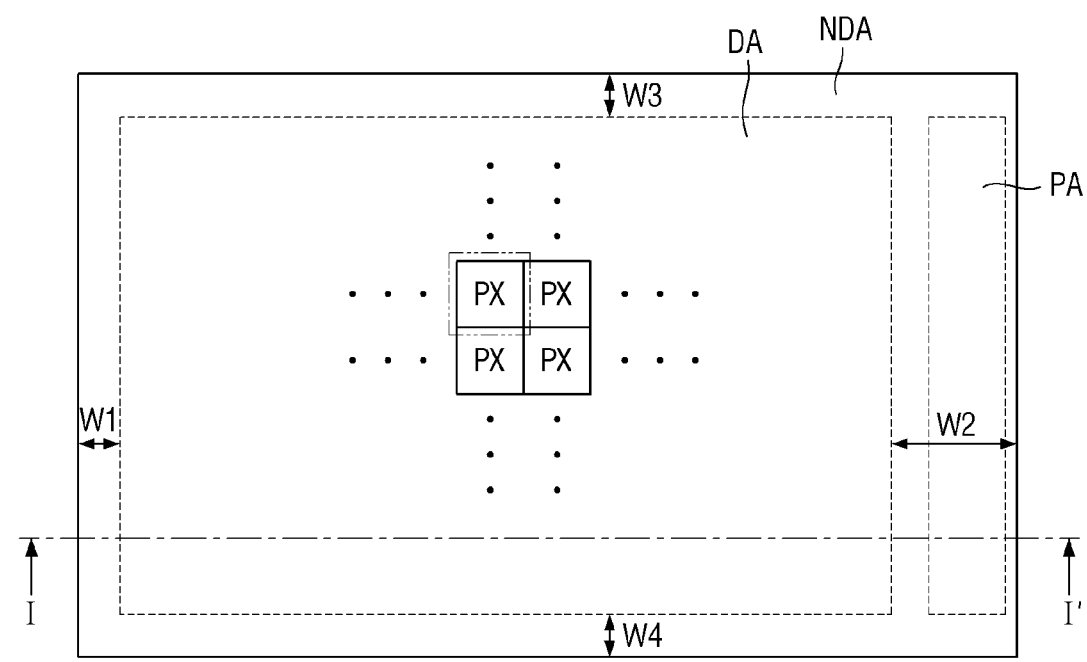
FIG. 2A is a plan view of a first display device of FIG. 1.
Figure 2A:
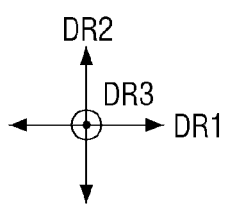
Figure 2B:
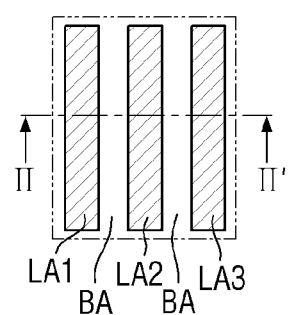
FIG. 2B is an enlarged plan view of the encircled portion of FIG. 2A.

FIG. 1 is a plan view showing a tiled display according to an embodiment of the disclosure. FIG. 2A is a plan view of a first display device of FIG. 1, and FIG. 2B is an enlarged plan view of the encircled portion of FIG. 2A.

Referring to FIGS. 1 and 2A, an embodiment of a tiled display 1 may have a rectangular shape when viewed from a top (i.e., a top plan view or a plan view in a thickness direction of the tiled display 1). It is, however, to be understood that the disclosure is not limited thereto. The shape of the tiled display 1 when viewed from the top may have a square, a circle, an ellipse, or other polygons. Herein, for convenience of description, embodiments where the tiled display 1 has a rectangular shape when viewed from the top will be described in detail. In such embodiments, the tiled display 1 having a rectangular shape when viewed from the top may include longer sides extending in a first direction DR1 and shorter sides extending in a second direction DR2. The corners where the longer side and the shorter side of the tiled display 1 meet may be formed at the right angle as shown in FIG. 1, but the disclosure is not limited thereto. The corners may be rounded. A third direction DR3 perpendicular to the first direction DR1 and the second direction DR2 may be the thickness direction of the tiled display 1.

In embodiments, the tiled display 1 may refer to a large display apparatus in which a plurality of display devices are arranged in a lattice pattern and adjacent display devices are combined with each other. In such embodiments, the tiled display 1 may include a plurality of display devices. The plurality of display devices may be connected in the first direction DR1 or the second direction DR2, and the tiled display 1 may have a certain shape. In one embodiment, for example, the plurality of display devices may have a same size as each other. It is, however, to be understood that the disclosure is not limited thereto. In one alternative embodiment, for example, the display devices may have different sizes from each other. The plurality of display devices may be arranged in a way such that the longer sides or the shorter sides of the display devices are connected with one another. Some of the display devices may be disposed at an edge of the tiled display 1 to form one side of the tiled display 1. Some of the display devices may be disposed at a corner of the tiled display 1 to form two adjacent sides of the tiled display 1. Some others of the display devices may be disposed on the inner side of the tiled display 1 and may be surrounded by the other display devices.

Herein, embodiments where the tiled display 1 includes four display devices will be described, for convenience of illustration and description. In such embodiments, the tiled display 1 may include a first display device 10, a second display device 11 located on one side of the first display device 10 in the first direction DR1, a third display device 12 located on one side of the first display device 10 in the second direction DR2, and a fourth display device 13 located on one side of the third display device 12 in the first direction DR1.

In an embodiment, as shown in FIG. 1, each of the display devices 10, 11, 12 and 13 may include a display area DA and a non-display area NDA. The display area DA may include a plurality of pixels PX to display images. The plurality of pixels PX may be arranged in a matrix pattern. The non-display area NDA may be disposed around the display area DA to surround the display area DA, and may display no image. The non-display area NDA may completely surround the display area DA when viewed from the top.

The non-display area NDA may be located on one side and the opposite side each of the display devices 10 in the first direction DR1, and one side and the opposite side each of the display devices 10 in the second direction DR2.

The non-display areas NDA of the display devices 10, 11, 12 and 13 may be connected with one another, and the display area DA of one of the display devices 10, 11, 12 and 13 may be spaced apart from the display device DA of another adjacent one of the display devices 10, 11, 12 and 13, with the non-display area NDA therebetween.

The first display device 10 and the second display device 11 of the tiled display 1 are located in the first row, and the third display device 12 and the fourth display device 13 thereof are located in the second row. In such an embodiment, the arrangement of the first display device 10 and the second display device 11 located in the first row may be substantially identical to the arrangement of the third display device 12 and the fourth display device 13 located in the second row. In such an embodiment, the first display device 10 and the third display device 12 may be located in the first column, and the second display device 11 and the fourth display device 13 may be located in the second column. The arrangement of the first display device 10 and the third display device 12 located in the first column may be substantially identical to the arrangement of the second display device 11 and the fourth display device 13 located in the second column.

The first display device 10 and the third display device 12 located in the first column may be connected with each other through a sealing member SEAL, and the second display device 11 and the fourth display device 13 located in the second column may be connected with each other through the sealing member SEAL. In such an embodiment, the first display device 10 and the second display device 11 located in the first row may be connected with each other not through the sealing member SEAL but may be connected (or disposed) with each other in a way such that the non-display area NDA of the first display device 10 overlaps the display area DA of the second display device 11, as shown in FIG. 1. The third display device 12 and the fourth display device 13 located in the second row may be connected with each other not through the sealing member SEAL but may be connected (or disposed) with each other in a way such that the non-display area NDA of the third display device 12 overlaps the display area DA of the fourth display device 13, as shown in FIG. 1.

In an embodiment, as shown in FIG. 2A, the non-display area NDA of each of the display devices 10, 11, 12 and 13 may include a pad area PA. The pad area PA of each of the display devices 10, 11, 12 and 13 may be located in the non-display area NDA on one side of each of the display devices 10, 11, 12 and 13 in the first direction DR1, as shown in FIG. 2A.

The width W2 of the non-display area NDA located on one side in the first direction DR1 may be greater than the width W1 of the non-display area NDA located on the opposite side in the first direction DR1. The width W3 of the non-display area NDA located on one side in the second direction DR2 may be substantially equal to the width W4 of the non-display area NDA located on the opposite side in the second direction DR2.

The pad area PA of the first display device 10 may be disposed to overlap the display area DA of the second display device 11 in the thickness direction (or in the third direction DR3), and the pad area PA of the third display device 12 may be disposed to overlap the display area DA of the fourth display device 13 in the thickness direction.

According to an embodiment, as the pad area PA of the first display device 10 may be disposed to overlap the display area DA of the second display device 11 in the thickness direction, and the pad area PA of the third display device 12 may be disposed to overlap the display area DA of the fourth display device 13 in the thickness direction, the seam area between the display devices adjacent to each other in the row direction may be effectively reduced.

Referring to FIG. 2B, each of the plurality of pixels PX of the display devices 10, 11, 12 and 13 may include light-emitting areas LA1, LA2 and LA3 defined by a pixel-defining layer, and may emit light having a predetermined peak wavelength through the light-emitting areas LA1, LA2 and LA3. In one embodiment, for example, the display area DA of each of the display devices may include first to third light-emitting areas LA1, LA2 and LA3. In each of the first to third light-emitting areas LA1, LA2 and LA3, light generated by light-emitting elements of the display devices exits out of the display devices.

The first to third light-emitting areas LA1, LA2 and LA3 may emit light having predetermined peak wavelengths to the outside of the display devices. The first light-emitting area LA1 may emit light of a first color, the second light-emitting area LA2 may emit light of a second color, and the third light-emitting area LA3 may emit light of a third color. In one embodiment, for example, the light of the first color may be red light having a peak wavelength in a range of about 610 nanometers (nm) to about 650 nm, the light of the second color may be green light having a peak wavelength in a range of about 510 nm to about 550 nm, and the light of the third color may be blue light having a peak wavelength in a range of about 440 nm to about 480 nm. It is, however, to be understood that the disclosure is not limited thereto.

In an embodiment, as shown in FIG. 2B, the display areas DA of the display devices 10, 11, 12 and 13 may include light-blocking areas BA located between the adjacent ones of the light-emitting areas LA1, LA2 and LA3. In one embodiment, for example, the light-blocking areas BA between the light-emitting areas may surround the first light-emitting area LA1 to the third light-emitting area LA3.

Hereinafter, for convenience of illustration and description, the first display device 10 and the second display device 11 of the tiled display will be described in detail and the same or like features of the third display device 12 and the fourth display device 13 as those of the first display device 10 and the second display device 11 will be omitted or simplified.

Figure 3:
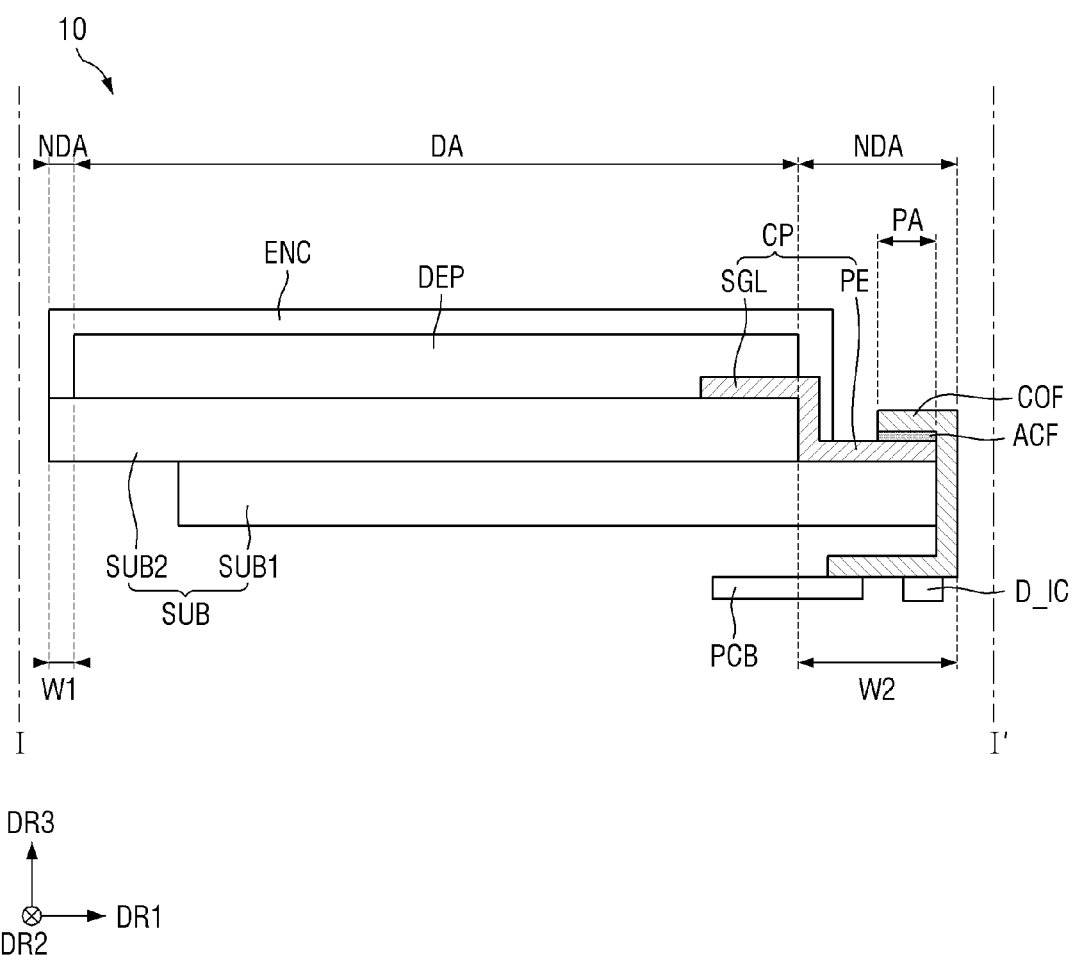
FIG. 3 is a cross-sectional view taken along line I-I' of FIG. 2A.

FIG. 3 is a cross-sectional view taken along line I-I' of FIG. 2A.

Referring to FIG. 3, in an embodiment, the first display device 10 may include a substrate unit SUB disposed across a display area DA and a non-display area NDA, a display element layer DEP disposed on the substrate unit SUB in the display area DA, an encapsulation member ENC disposed across the display area DA and the non-display area NDA to encapsulate the display element layer DEP, and a pad electrode PE disposed in the pad area PA.

The substrate unit SUB may include a first substrate SUB1 and a second substrate SUB2 disposed between the first substrate SUB1 and the display element layer DEP.

In an embodiment, as shown in FIG. 3, the side surfaces of the first substrate SUB1 and the side surfaces of the second substrate SUB2 may not be aligned with each other in the thickness direction. In such an embodiment, the first substrate SUB1 and the second substrate SUB2 may each include a first side surface on one side in the first direction DR1 and a second side surface on the opposite side in the first direction DR1.

The first side surface of the first substrate SUB1 and the first side surface of the second substrate SUB2 may not be aligned with each other in the thickness direction, and the second side surface of the first substrate SUB1 and the second side surface of the second substrate SUB2 may not be aligned with each other in the thickness direction.

In one embodiment, for example, as shown in FIG. 3, the first side surface of the first substrate SUB1 may protrude from the first side surface of the second substrate SUB2 on one side in the first direction DR1.

The display element layer DEP may be disposed on the second substrate SUB2.

The encapsulation layer ENC may be disposed on the display element layer DEP and may encapsulate the display element layer DEP.

The pad electrode PE may be disposed on a part of the upper surface of the first substrate SUB1 that protrudes from the second substrate SUB2 on one side in the first direction DR1.

The first display device 10 may further include a signal connection line SGL electrically connecting the pad electrode PE with the display element layer DEP. The pad electrode PE and the signal connection line SGL may be formed, but is not limited to, via a same process as a single unitary unit. The pad electrode PE and the signal connection line SGL may form a conductive pattern CP.

The signal connection line SGL may be disposed on a part of the upper surface of the first substrate SUB1 that protrudes from the second substrate SUB2 on the side in the first direction DR1, on the first side surface of the second substrate SUB2, and on the upper surface of the second substrate SUB2.

The signal connection line SGL may be electrically connected to a thin-film transistor of the display element layer DEP.

The first display device 10 may further include a chip-on film COF electrically connected to the pad electrode PE and a driver D_IC is disposed thereon. One end of the chip-on film COF may overlap the pad electrode PE in the thickness direction, and an opposite end thereof may be disposed below the first substrate SUB1.

The first display device 10 may further include a printed circuit board PCB connected to the opposite end of the chip-on film COF.

Figure 4:
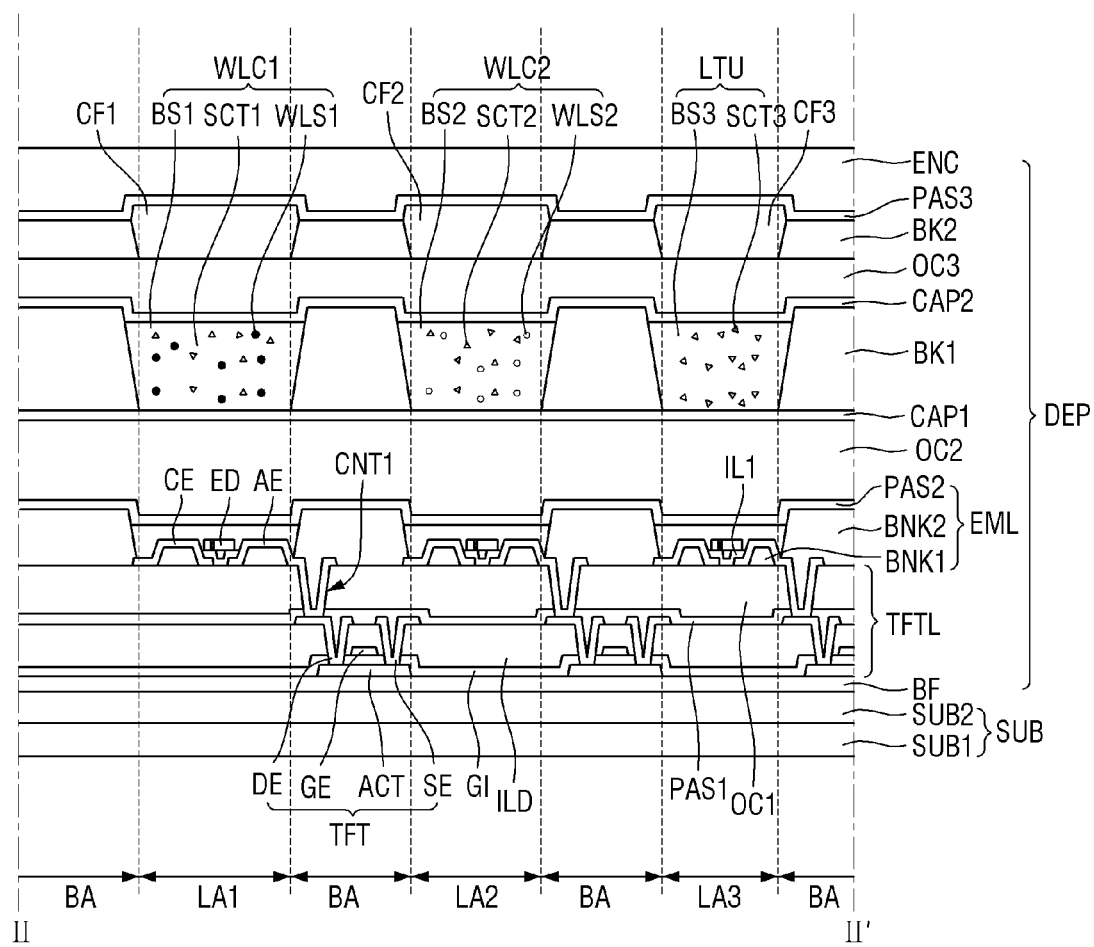
FIG. 4 is a cross-sectional view taken along line II-II of FIG. 2B.

FIG. 4 is a cross-sectional view taken along line II-II of FIG. 2B.

Referring to FIGS. 3 and 4, the substrate unit SUB may include or be made of an insulating material such as a polymer resin. The insulating material may include, but is not limited to, polyimide ("PI"). The first substrate SUB1 and the second substrate SUB2 may include a same material as each other.

The display element layer DEP may include a buffer layer BF, a thin-film transistor layer TFTL, an emission material layer EML, a second planarization layer OC2, a first capping layer CAP1, a first light-blocking member BK1, a first wavelength-converting unit WLC1, a second wavelength-converting unit WLC2, a light-transmitting unit LTU, a second capping layer CAP2, a third planarization layer OC3, a second light-blocking member BK2, first to third color filters CF1, CF2 and CF3, a third passivation layer PAS3, and an encapsulation member ENC.

The buffer layer BF may be disposed on the substrate 100. The buffer layer BF may include or be formed of an inorganic film that can prevent the permeation of air or moisture.

The thin-film transistor layer TFTL may include a thin-film transistor TFT, a gate insulator GI, an interlayer dielectric layer ILD, a first passivation layer PAS1, and a first planarization layer OC1.

The thin-film transistor TFT may be disposed on the buffer layer BF, and may define a pixel circuit of each of a plurality of pixels.

The semiconductor layer ACT may be disposed on the buffer layer BF. The semiconductor layer ACT may overlap the gate electrode GE, the source electrode SE and the drain electrode DE in the third direction DR3. The semiconductor layer ACT may be in direct contact with the source electrode SE and the drain electrode DE, and may face the gate electrode GE with the gate insulating layer GI therebetween.

The gate electrode GE may be disposed on the gate insulator GI. The gate electrode GE may overlap the semiconductor layer ACT in the third direction DR3 with the gate insulating layer GI interposed therebetween.

The source electrode SE and the drain electrode DE are disposed on the interlayer dielectric layer ILD in a way such that the source electrode SE and the drain electrode DE are spaced apart from each other. The source electrode SE may be in contact with one end of the semiconductor layer ACT through a contact hole defined or formed in the gate insulating layer GI and the interlayer dielectric layer ILD. The drain electrode DE may be in contact with the other end of the semiconductor layer ACT through a contact hole defined or formed in the gate insulating layer GI and the interlayer dielectric layer ILD. The drain electrode DE may be connected to a first electrode AE of a light-emitting element EL through a contact hole defined or formed in the first passivation layer PAS1 and the first planarization layer OC1.

The gate insulator GI may be disposed on the semiconductor layer ACT. In one embodiment, for example, the gate insulating layer GI may be disposed on the semiconductor layer ACT and the buffer layer BF, and may insulate the semiconductor layer ACT from the gate electrode GE. Contact holes are defined through the gate insulating layer GI such that the source electrode SE and the drain electrode DE are disposed through the contact hole to contact the semiconductor layer ACT.

The interlayer dielectric layer ILD may be disposed over the gate electrode GE. In one embodiment, for example, the contact holes, through which the source electrode SE and the drain electrode DE are disposed, are defined further through the interlayer dielectric layer ILD.

The first passivation layer PAS1 may be disposed above the thin-film transistor TFT to protect the thin-film transistor TFT. In one embodiment, for example, a contact hole, through which the first electrode AE is disposed, may be defined through the first passivation layer PAS1.

The first planarization layer OC1 may be disposed on the first passivation layer PAS1 to provide a flat surface over the thin-film transistor TFT. In one embodiment, for example, a contact hole, through which the first electrode AE of the light-emitting element EL, is disposed may be defined through the first planarization layer OC1.

The emission material layer EML may include a light-emitting element EL, a first bank BNK1, a second bank BNK2, and a second passivation layer PAS2.

The light-emitting element EL may be disposed on the thin-film transistor TFT. The light-emitting element EL may include a first electrode AE, a second electrode CE, and a light-emitting diode ED.

The first electrode AE may be disposed on the first planarization layer OC1. In one embodiment, for example, the first electrode AE may be disposed over the first bank BNK1 disposed on the first planarization layer OC1 to cover the first bank BNK1. The first electrode AE may be disposed to overlap one of the first to third light-emitting areas LA1, LA2 and LA3 defined by the second bank BNK2. The first electrode AE may be connected to the drain electrode DE of the thin-film transistor TFT.

The second electrode CE may be disposed on the first planarization layer OC1. In one embodiment, for example, the second electrode CE may be disposed over the first bank BNK1 disposed on the first planarization layer OC1 to cover the first bank BNK1. The second electrode CE may be disposed to overlap one of the first to third light-emitting areas LA1, LA2 and LA3 defined by the second bank BNK2. In one embodiment, for example, the second electrode CE may receive a common voltage applied to all pixels.

The first insulating layer IL1 may cover a part of the first electrode AE and a part of the second electrode CE adjacent to each other and may insulate the first and second electrodes AE and CE from each other.

The light-emitting diode ED may be disposed between the first electrode AE and the second electrode CE above the first planarization layer OC1. The light-emitting diode ED may be disposed on the first insulating layer IL1. One end of the light-emitting diode ED may be connected to the first electrode AE, and another end of the light-emitting diode ED may be connected to the second electrode CE. In one embodiment, for example, the plurality of light-emitting elements ED may include active layers having a same material as each other so that they may emit light of a same wavelength or light of a same color as each other. The lights emitted from the first to third light-emitting areas LA1, LA2 and LA3, respectively, may have a same color as each other. In one embodiment, for example, the plurality of light-emitting diodes ED may emit light of the third color or blue light having a peak wavelength in a range of about 440 nm to about 480 nm.

The second bank BNK2 may be disposed on the first planarization layer OC1 to define first to third light-emitting areas LA1, LA, and LA3. In one embodiment, for example, the second bank BNK2 may surround each of the first to third light-emitting areas LA1, LA2 and LA3. It is, however, to be understood that the disclosure is not limited thereto. The second bank BNK2 may be disposed in each of the light-blocking areas BA.

The second passivation layer PAS2 may be disposed on the plurality of light-emitting elements EL and the second banks BNK2. The second passivation layer PAS2 may cover the plurality of light-emitting elements EL to protect the plurality of light-emitting elements EL.

The display device may further include the second planarization layer OC2, the first capping layer CAP1, the first light-blocking member BK1, the first wavelength-converting unit WLC1, the second wavelength-converting unit WLC2, the light-transmitting unit LTU, the second capping layer CAP2, the third planarization layer OC3, the second light-blocking member BK2, the first to third color filters CF1, CF2 and CF3, the third passivation layer PAS3, and the encapsulation member ENC.

The second planarization layer OC2 may be disposed on the emission material layer EML to provide a flat surface over the emission material layer EML. The second planarization layer OC2 may include an organic material.

The first capping layer CAP1 may be disposed on the second planarization layer OC2. The first capping layer CAP1 may seal the lower surfaces of the first and second wavelength-converting units WLC1 and WLC2 and the light-transmitting unit LTU. The first capping layer CAP1 may include an inorganic material.

The first light-blocking member BK1 may be disposed on the first capping layer CAP1 in the light-blocking area BA. The first light-blocking member BK1 may overlap the second bank BNK2 in the thickness direction. The first light-blocking member BK1 may block the transmission of light.

The first light-blocking member BK1 may include an organic light-blocking material and a liquid repellent component.

Since the first light-blocking member BK1 includes the liquid repellent component, the first and second wavelength-converting units WLC1 and WLC2 and the light-transmitting unit LTU may be separated from each other so that the first and second wavelength-converting units WLC1 and WLC2 and the light-transmitting unit LTU may correspond to the respective light-emitting areas LA.

The first wavelength converter WLC1 may be disposed in the first emission area LA1 on the first capping layer CAP1. The first wavelength converter WLC1 may be surrounded by the first light blocking member BK1. The first wavelength-converting unit WLC1 may include a first base resin BS1, first scatterers SCT1, and first wavelength shifters WLS1.

The first base resin BS1 may include a material having a relatively high light transmittance. The first base resin BS1 may be made of a transparent organic material. In one embodiment, for example, the first base resin BS1 may include at least one organic material selected from an epoxy resin, an acrylic resin, a cardo resin, and an imide resin.

The first scatterers SCT1 may have a refractive index different from that of the first base resin BS1 and may form an optical interface with the first base resin BS1.

The first wavelength shifters WLS1 may convert or shift the peak wavelength of the incident light to a first peak wavelength. In one embodiment, for example, the first wavelength shifters WLS1 may convert blue light provided from the display device into red light having a single peak wavelength in a range of about 610 nm to about 650 nm, and output the light. The first wavelength shifters WLS1 may be quantum dots, quantum rods, or phosphor. The quantum dots may be particulate matter that emits a color as electrons transition from the conduction band to the valence band.

The light output from the first wavelength shifters WLS1 may have a full width of half maximum ("FWHM") of the emission wavelength spectrum of about 45 nm or less, about 40 nm or less, or about 30 nm or less. In such an embodiment, the color purity and color gamut of the colors displayed by the display device may be further improved.

A part of the blue light emitted from the emission material layer EML may pass through the first wavelength-converting unit WLC1 without being converted into red light by the first wavelength shifters WLS1. When such blue light is incident on the first color filter CF1, the blue light may be blocked by the first color filter CF1. In such an embodiment, red light converted by the first wavelength-converting unit WLC1 may pass through the first color filter CF1 to exit to the outside. Accordingly, the first light-emitting area LA1 may emit red light.

The second wavelength-converting unit WLC2 may be disposed in the second light-emitting area LA2 on the first capping layer CAP1. The second wavelength-converting unit WLC2 may be surrounded by the first light-blocking member BK1. The second wavelength-converting unit WLC2 may include a second base resin BS2, second scatterers SCT2, and second wavelength shifters WLS2.

The second base resin BS2 may include a material having a relatively high light transmittance. The second base resin BS2 may include or be made of a transparent organic material.

The second scatterers SCT2 may have a refractive index different from that of the second base resin BS2 and may form an optical interface with the second base resin BS2. In one embodiment, for example, the second scatterers SCT2 may include a light scattering material or light scattering particles that scatter at least a part of transmitted light.

The second wavelength shifters WLS2 may convert or shift the peak wavelength of the incident light to a second peak wavelength that is different from the first peak wavelength of the first wavelength shifters WLS1. In one embodiment, for example, the second wavelength shifters WLS2 may convert blue light provided from the display device into green light having a single peak wavelength in a range of about 510 nm to about 550 nm, and output the light. The second wavelength shifters WLS2 may be quantum dots, quantum rods, or phosphor. The second wavelength shifters WLS2 may include at least one selected from the above-listed materials of the first wavelength shifters WLS1.

The light-transmitting unit LTU may be disposed in the third light-emitting area LA3 on the first capping layer CAP1. The light-transmitting unit LTU may be surrounded by the first light-blocking member BK1. The light-transmitting unit LTU may transmit the incident light without converting its peak wavelength. The light-transmitting unit LTU may include a third base resin BS3 and third scatterers SCT3.

The third base resin BS3 may include a material having a relatively high light transmittance. The third base resin BS3 may include or be made of a transparent organic material.

The third scatterers SCT3 may have a refractive index different from that of the third base resin BS3 and may form an optical interface with the third base resin BS3. In one embodiment, for example, the third scatterers SCT3 may include a light scattering material or light scattering particles that scatter at least a part of transmitted light.

The first and second wavelength-converting units WLC1 and WLC2 and the light-transmitting unit LTU are disposed on the emission material layer EML through the second planarization layer OC2 and the first capping layer CAP1. Therefore, the display device may not include a separate substrate for the first and second wavelength-converting units WLC1 and WLC2 and the light-transmitting unit LTU.

The second capping layer CAP2 may cover the first and second wavelength-converting units WLC1 and WLC2, the light-transmitting unit LTU, and the first light-blocking member BK1.

The third planarization layer OC3 may be disposed on the second capping layer CAP2 to provide the flat top surfaces of the first and second wavelength-converting units WLC1 and WLC2 and the light-transmitting part LTU. The third planarization layer OC3 may include an organic material.

The second light-blocking member BK2 may be disposed on the third planarization layer OC3 in the light-blocking area BA. The second light-blocking member BK2 may overlap the first light-blocking member BK1 or the second bank BNK2 in the thickness direction. The second light-blocking member BK2 may block the transmission of light.

The first color filter CF1 may be disposed in the first light-emitting area LA1 on the third planarization layer OC3. The first color filter CF1 may be surrounded by the second light blocking member BK2. The first color filter CF1 may overlap the first wavelength-converting unit WLC1 in the thickness direction. The first color filter CF1 may selectively transmit light of the first color (e.g., red light) and may block and absorb light of the second color (e.g., green light) and light of the third color (e.g., blue light).

The second color filter CF2 may be disposed in the second light-emitting area LA2 on the third planarization layer OC3. The second color filter CF2 may be surrounded by the second light-blocking member BK2. The second color filter CF2 may overlap the second wavelength-converting unit WLC2 in the thickness direction. The second color filter CF2 may selectively transmit light of the second color (e.g., green light) and may block and absorb light of the first color (e.g., red light) and light of the third color (e.g., blue light).

The third color filter CF3 may be disposed in the third light-emitting area LA3 on the third planarization layer OC3. The third color filter CF3 may be surrounded by the second light-blocking member BK2. The third color filter CF3 may overlap the light-transmitting unit LTU in the thickness direction. The third color filter CF3 may selectively transmit light of the third color (e.g., blue light) and may block and absorb light of the first color (e.g., red light) and light of the second color (e.g., green light).

The first to third color filters CF1, CF2 and CF3 may absorb a part of the light introduced from the outside of the display device to reduce reflection of external light. Accordingly, the first to third color filters CF1, CF2 and CF3 may prevent color distortion due to reflection of external light.

The third passivation layer PAS3 may cover the first to third color filters CF1, CF2 and CF3. The third passivation layer PAS3 may protect the first to third color filters CF1, CF2 and CF3.

The encapsulation member ENC may be disposed on the third passivation layer PAS3. In one embodiment, for example, the encapsulation member ENC may include at least one inorganic layer to prevent permeation of oxygen or moisture. In such an embodiment, the encapsulation member ENC may include at least one organic layer to protect the display device from foreign substances such as dust.

Figure 5:
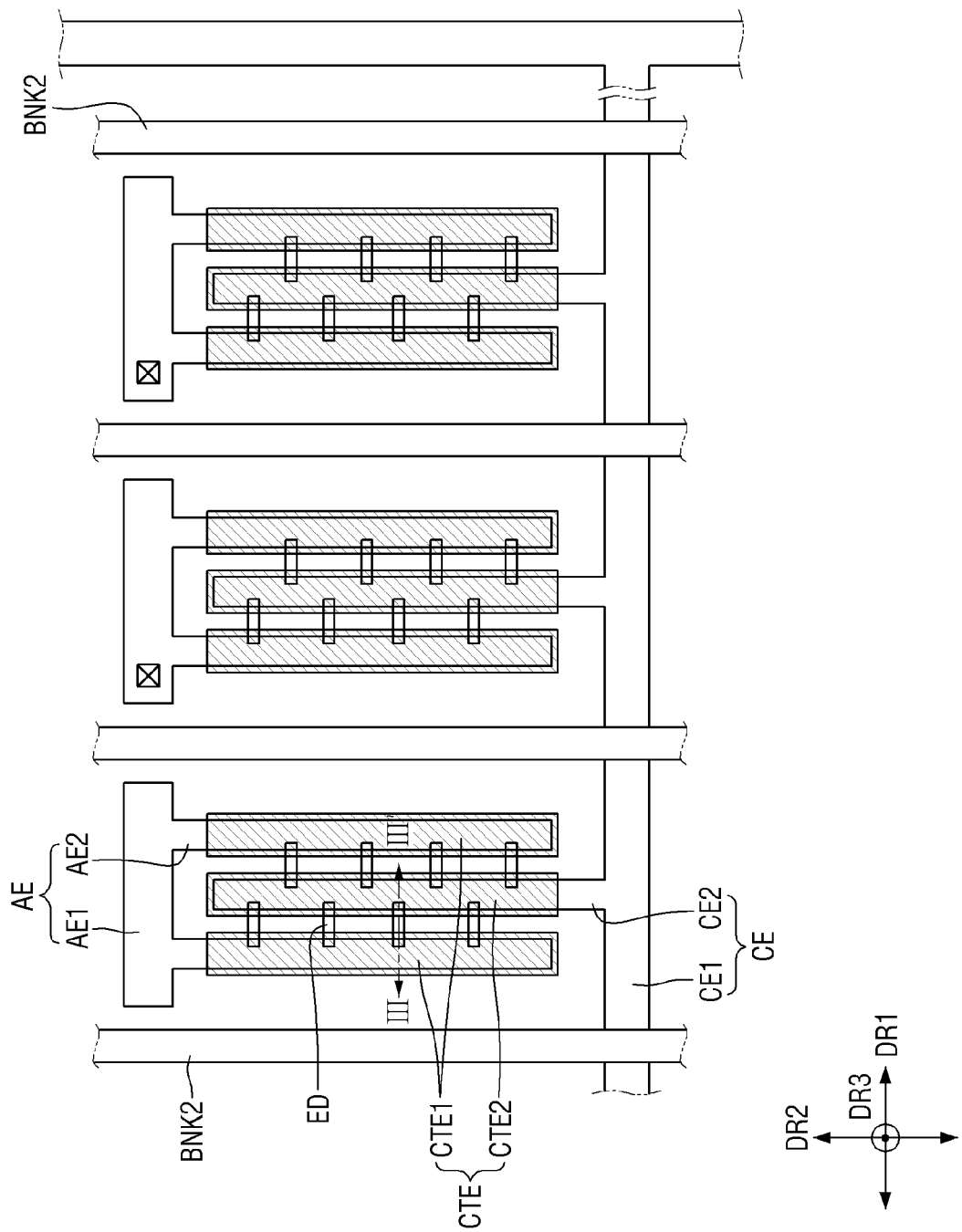
FIG. 5 is a plan view showing a single pixel of a first display device according to an embodiment of the disclosure.
Figure 6A:
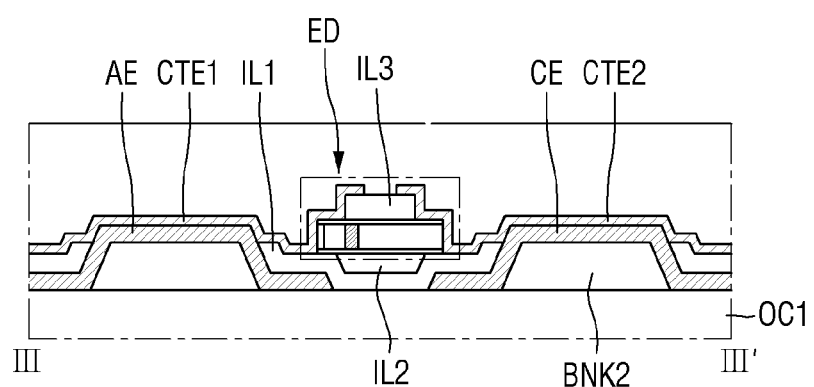
FIG. 6A is a cross-sectional view taken along line III-III' of FIG. 5.

FIG. 5 is a plan view showing a single pixel of a first display device according to an embodiment of the disclosure. FIG. 6A is a cross-sectional view taken along line III-III' of FIG. 5, and FIG. 6B is an enlarged view of the encircled portion of FIG. 6A.

Figure 6B:
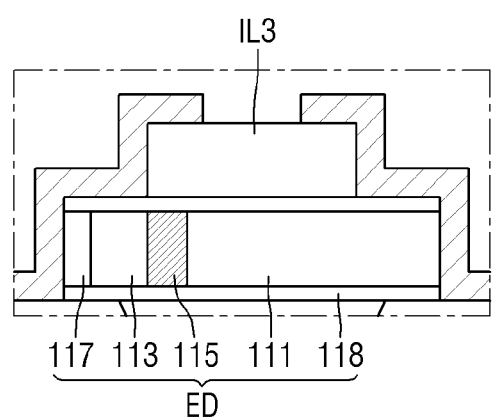
FIG. 6B is an enlarged view of the encircled portion of FIG. 6A.

Referring to FIGS. 5, 6A and 6B in conjunction with FIG. 4, each of the plurality of pixels may include first to third sub-pixels. The first to third sub-pixels may correspond to the first to third light-emitting areas LA1, LA2 and LA3, respectively. The light-emitting diodes ED of each of the first to third sub-pixels may emit light through the first to third light-emitting areas LA1, LA2 and LA3.

In an embodiment, the first to third sub-pixels may emit light of a same color as each other. In one embodiment, for example, each of the first to third sub-pixels may include the light-emitting diodes ED of a same type as each other, and may emit light of the third color or blue light. In one alternative embodiment, for example, the first sub-pixel may emit light of the first color or red light, the second sub-pixel may emit light of the second color or green light, and the third sub-pixel may emit light of the third color or blue light.

Each of the first to third sub-pixels may include first and second electrodes AE and CE, light-emitting diodes ED, a plurality of contact electrodes CTE, and a plurality of second banks BNK2.

The first and second electrodes AE and CE are electrically connected to the light-emitting elements ED to receive a predetermined voltage, and the light-emitting elements ED may emit light of a certain wavelength band. At least a part of the first and second electrodes AE and CE may form an electric field in the pixel, and the light-emitting elements ED may be aligned by the electric field.

In one embodiment, for example, the first electrode AE may be a pixel electrode disposed separately in each of the first to third sub-pixels, while the second electrode CE may be a common electrode commonly connected to the first to third sub-pixels. One of the first electrode AE and the second electrode CE may be the anode electrode of the light-emitting elements ED, while the other of the first electrode AE and the second electrode CE may be the cathode electrode of the light-emitting elements ED.

In an embodiment, as shown in FIG. 5, the first electrode AE may include a first electrode stem AE1 extending in the first direction DR1, and at least one first electrode branch AE2 branching off from the first electrode stem AE1 and extending in the second direction DR2.

The first electrode stem AE1 of each of the first to third sub-pixels may be spaced apart from the first electrode stem AE1 of an adjacent sub-pixel, and the first electrode stem AE1 may be disposed on an imaginary extension line with the first electrode stem AE1 of the sub-pixel adjacent in the first direction DR1. The first electrode stems AE1 of the first to third sub-pixels may receive different signals, respectively, and may be driven individually.

The first electrode branch part AE2 may branch off from the first electrode stem AE1 and may extend in the second direction DR2. One end of the first electrode branch AE2 may be connected to the first electrode stem AE1, while the other end of the first electrode branch AE2 may be spaced apart from the second electrode stem CE1 opposed to the first electrode stem AE1.

The second electrode CE may include a second electrode stem CE1 extended in the first direction DR1, and a second electrode branch CE2 branching off from the second electrode stem CE1 and extending in the second direction DR2. The second electrode stem CE1 of each of the first to third sub-pixels may be connected to the second electrode stem CE1 of an adjacent sub-pixel. The second electrode stem CE1 may extend in the first direction DR1 to traverse the plurality of pixels. The second electrode stem CE1 may be connected to a portion extending in a direction at the outer portion of the display area DA or in the non-display area NDA.

The second electrode branch CE2 may be spaced apart from and face the first electrode branch AE2. One end of the second electrode branch CE2 may be connected to the second electrode stem CE1, while the other end of the second electrode branch CE2 may be spaced apart from the first electrode stem AE1.

The first electrode AE may be electrically connected to the thin-film transistor layer TFTL of the display device through a first contact hole CNT1, and the second electrode CE may be electrically connected to the thin-film transistor layer TFTL of the display device through a second contact hole (not shown).

The second bank BNK2 may be disposed at a boundary between the pixels. The plurality of first electrode stems AE1 may be spaced apart from one another with respect to the second banks BNK2. The second banks BNK2 may extend in the second direction DR2 and may be disposed at the boundaries of the pixels SP arranged in the first direction DR1. In such an embodiment, the second banks BNK2 may be disposed at boundaries of the pixels SP arranged in the second direction DR2 as well. The second banks BNK2 may define the boundaries of the plurality of pixels.

When an ink, in which the light-emitting elements ED are dispersed, is ejected during a process of fabricating the display device, the second bank BNK2 may prevent the ink from flowing over the boundaries of the pixels SP. The second bank BNK2 may separate inks, in which different light-emitting diodes ED are dispersed, so that the inks are not mixed with each other.

The light-emitting elements ED may be disposed between the first electrode AE and the second electrode CE. One end of the light-emitting diode ED may be connected to the first electrode AE, and another end of the light-emitting diode ED may be connected to the second electrode CE.

The light-emitting diodes ED may be spaced apart from one another and may be substantially aligned in parallel with one another. The spacing between the light-emitting diodes ED is not particularly limited herein.

The plurality of light-emitting diodes ED may include active layers having a same material as each other so that they may emit light of a same wavelength range or light of a same color as each other. The first to third sub-pixels may emit light of the same color. In one embodiment, for example, the plurality of light-emitting diodes ED may emit light of the third color or blue light having a peak wavelength in a range of about 440 nm to about 480 nm.

The contact electrodes CTE may include first and second contact electrodes CTE1 and CTE2. The first contact electrode CTE1 may cover the first electrode branch AE2 and parts of the light-emitting diodes ED, and may electrically connect the first electrode branch AE2 to the light-emitting diodes ED. The second contact electrode CTE2 may cover the second electrode branch CE2 and other parts of the light-emitting diodes ED, and may electrically connect the second electrode branch CE2 to the light-emitting diodes ED.

The first contact electrode CTE1 may be disposed on the first electrode branch AE2 and extend in the second direction DR2. The first contact electrode CTE1 may be in contact with first ends of the light-emitting diodes ED. The light-emitting diodes ED may be electrically connected to the first electrode AE through the first contact electrode CTE1.

The second contact electrode CTE2 may be disposed on the second electrode branch CE2 and extend in the second direction DR2. The second contact electrode CTE2 may be spaced apart from the first contact electrode CTE1 in the first direction DR1. The second contact electrode CTE2 may be in contact with second ends of the light-emitting diodes ED. The light-emitting diodes ED may be electrically connected to the second electrode CE through the second contact electrode CTE2.

The emission material layer EML of the display device may be disposed on the thin-film transistor layer TFTL, and may include first to third insulating layers IL', IL2 and IL3.

The plurality of first banks BNK1 may be disposed in the first to third light-emitting areas LA1, LA2 and LA3, respectively. Each of the plurality of first banks BNK1 may correspond to the first electrode AE or the second electrode CE. Each of the first and second electrodes AE and CE may be disposed on a corresponding first bank BNK1.

The plurality of first banks BNK1 may be disposed on the first planarization layer OC1, and side surfaces of each of the plurality of first banks BNK1 may be inclined with respect to the first planarization layer OC1. The inclined surfaces of the first banks BNK1 may reflect light emitted from the light-emitting diodes ED.

The first electrode stem AE1 may include a portion disposed in the first contact hole CNT1 defined through the first planarization layer OC1. The first electrode stem AE1 may be electrically connected to the thin-film transistor TFT through the first contact hole CNT1.

The second electrode stem CE1 may extend in the first direction DR1 and may be disposed also in a non-light-emitting area where the light-emitting diodes ED are not disposed. The second electrode stem CE1 may include a portion disposed in the second contact hole defined through the first planarization layer OC1. The second electrode stem CE1 may be electrically connected to a power electrode through the second contact hole. The second electrode CE may receive a predetermined electric signal from the power electrode.

The first and second electrodes AE and CE may include a transparent conductive material. The first and second electrodes AE and CE may include a conductive material with high reflectivity. The first and second electrodes AE and CE may include or be made up of a stack of one or more transparent conductive materials and one or more metals having high reflectivity or a single layer including at least one selected from such materials.

The first insulating layer IL1 may be disposed on the first planarization layer OC1, the first electrode AE, and the second electrode CE. The first insulating layer IL1 may partially cover each of the first and second electrodes AE and CE.

The first insulating layer IL1 may protect the first and second electrodes AE and CE and may insulate the first and second electrodes AE and CE from each other. The first insulating layer IL1 may prevent the light-emitting elements ED from being in direct contact with other elements and being damaged thereby.

The light-emitting elements ED may be disposed between the first electrode AE and the second electrode CE on the first and second insulating layers IL1 and IL2. One end of the light-emitting diode ED may be connected to the first electrode AE, and the other end of the light-emitting diode ED may be connected to the second electrode CE.

The third insulating layer IL3 may be partially disposed on the light-emitting diodes ED disposed between the first electrode AE and the second electrode CE. The third insulating layer IL3 may partially surround an outer surface of the light-emitting diodes ED. The third insulating layer IL3 may protect the light-emitting diodes ED. The third insulating layer IL3 may surround the outer surface of the light-emitting diodes ED.

The contact electrodes CTE may include first and second contact electrodes CTE1 and CTE2. The first contact electrode CTE1 may cover the first electrode branch AE2 and parts of the light-emitting diodes ED, and may electrically connect the first electrode branch AE2 to the light-emitting diodes ED. The second contact electrode CTE2 may cover the second electrode branch CE2 and other parts of the light-emitting diodes ED, and may electrically connect the second electrode branch CE2 to the light-emitting diodes ED.

The first contact electrode CTE1 may be disposed on the first electrode branch AE2 and extend in the second direction DR2. The first contact electrode CTE1 may be in contact with first ends of the light-emitting diodes ED. The light-emitting diodes ED may be electrically connected to the first electrode AE through the first contact electrode CTE1.

The second contact electrode CTE2 may be disposed on the second electrode branch CE2 and extend in the second direction DR2. The second contact electrode CTE2 may be spaced apart from the first contact electrode CTE1 in the first direction DR1. The second contact electrode CTE2 may be in contact with second ends of the light-emitting diodes ED. The light-emitting diodes ED may be electrically connected to the second electrode CE through the second contact electrode CTE2.

The contact electrodes CTE may include a conductive material.

Figure 7:
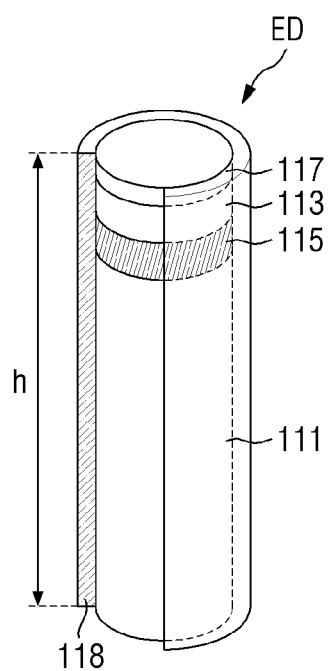
FIG. 7 is a view showing a light-emitting element according to an embodiment of the disclosure.

FIG. 7 is a view showing a light-emitting element according to an embodiment of the disclosure.

Referring to FIG. 7, the light-emitting element ED may be a light-emitting diode. In one embodiment, for example, the light-emitting elements ED may have a size of a micrometer or a nano-meter, and may be an inorganic light-emitting diode including an inorganic material. Such an inorganic light-emitting diode may be aligned between two electrodes facing each other by an electric field formed in a particular direction between the two electrodes.

The light-emitting element ED may have a shape extending in one direction. The light-emitting diode ED may have a shape of a rod, wire, tube, etc. The light-emitting element ED may include a first semiconductor layer 111, a second semiconductor layer 113, an active layer 115, an electrode layer 117, and an insulating layer 118.

The first semiconductor layer 111 may be an n-type semiconductor. The second semiconductor layer 113 may be disposed on the active layer 115. Each of the first and second semiconductor layers 111 and 113 may be made up of, but is not limited to, a single layer or have a single layer structure.

The active layer 115 may be disposed between the first and second semiconductor layers 111 and 113. The active layer 115 may include a material having a single or multiple quantum well structure. In such an embodiment where the active layer 115 includes a material having the multiple quantum well structure, quantum layers and well layers may be alternately stacked on one another.

The light emitted from the active layer 1115 may exit in the longitudinal direction of the light-emitting elements ED as well as through side surfaces. The directivity of light emitted from the active layer 115 may not be limited.

In one embodiment, for example, the electrode layer 117 may be an ohmic contact electrode. In one alternative embodiment, for example, the electrode layer 117 may be a Schottky contact electrode. The light-emitting diode ED may include at least one electrode layer 117.

The insulating layer 118 may surround the outer surfaces of the plurality of semiconductor layers and electrode layers. The insulating layer 118 may surround the outer surface of the active layer 115, and may extend in the direction in which the light-emitting element ED extends. The insulating layer 118 may protect the light-emitting element ED.

The insulating layer 118 may include a material having an insulating property such as silicon oxide (SiOx), silicon nitride (SiNx), silicon oxynitride (SiOxNy), aluminum nitride (AlN) or aluminum oxide ($Al_2O_3$).

The outer surface of the insulating layer 118 may be subjected to surface treatment. The light-emitting diodes ED may be dispersed in an ink and the ink is sprayed onto the electrode so that third light-emitting diodes ED are aligned during the process of fabricating the display device.

Hereinafter, an arrangement relationship between the first display device 10 and the second display device 11 of the tiled display 1 will be described in greater detail.

Figure 8A:
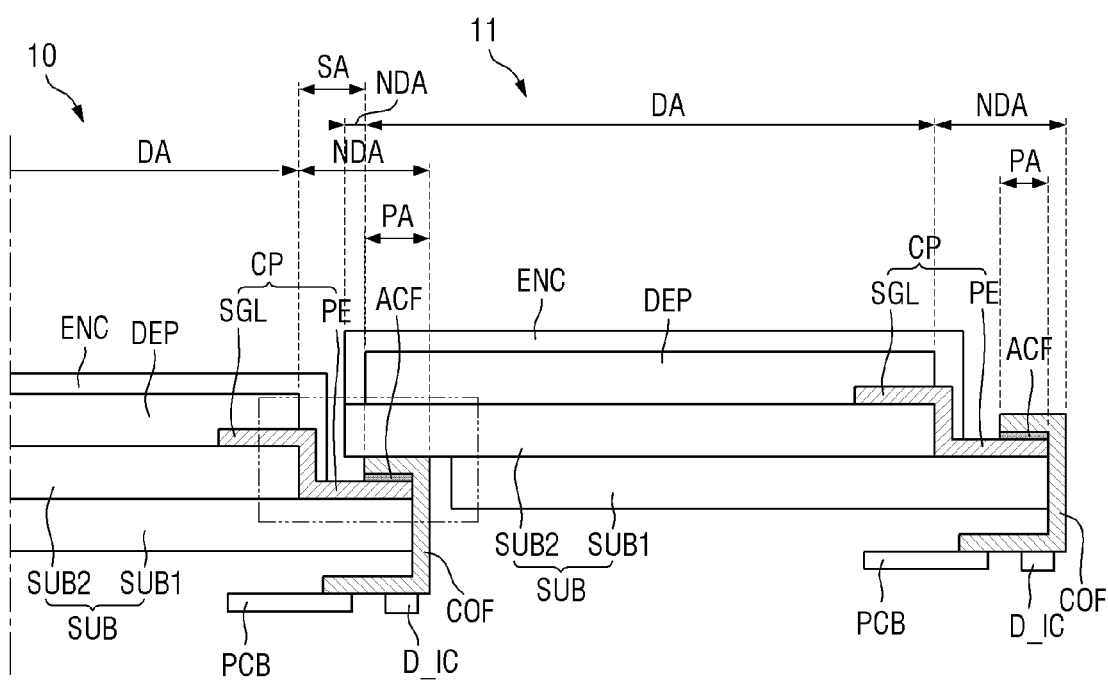
FIG. 8A is a cross-sectional view of the first display device and the second display device of the tiled display of FIG. 1.
Figure 8A:
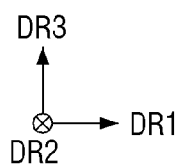
Figure 8B:
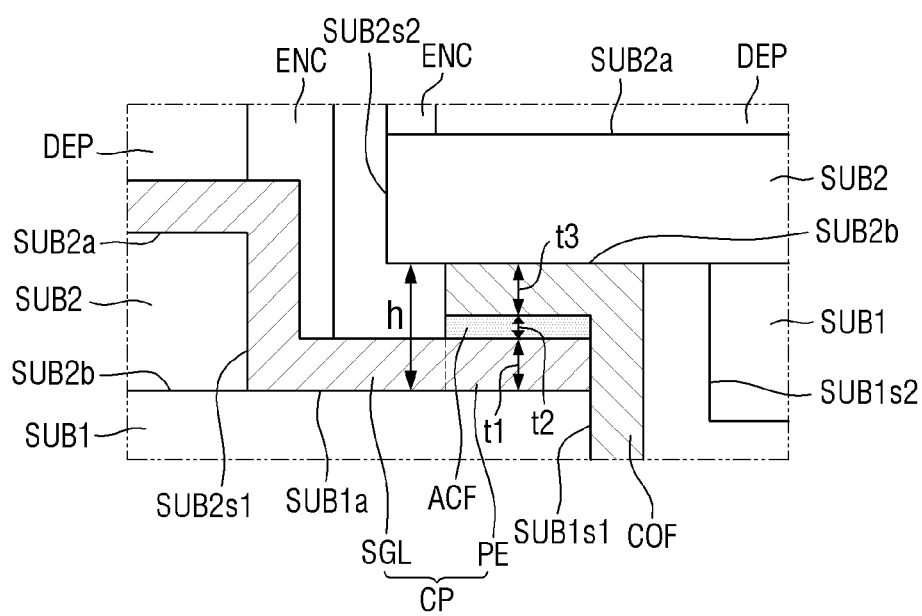
FIG. 8B is an enlarged view of the encircled portion of FIG. 8A.

FIG. 8A is a cross-sectional view of the first display device and the second display device of the tiled display of FIG. 1, and FIG. 8B is an enlarged view of the encircled portion of FIG. 8A.

Referring to FIGS. 8A and 8B, the second display device 11 has substantially a same structure as the first display device 10 described above with reference to FIG. 3. The second display device 11 may include a substrate unit SUB disposed across a display area DA and a non-display area NDA, a display element layer DEP on the substrate unit SUB disposed in the display area DA, an encapsulation member ENC disposed across the display area DA and the non-display area NDA to encapsulate sealing the display element layer DEP, and a pad electrode PE disposed in the pad area PA.

The substrate unit SUB may include a first substrate SUB1 and a second substrate SUB2 disposed between the first substrate SUB1 and the display element layer DEP.

The first substrate SUB1 of each of the first display device 10 and the second display device 11 may include an upper surface SUB1a, a lower surface SUB1b, a first side surface SUB1s1 and a second side surface SUB1s2.

The pad electrode PE may be disposed on a part of the upper surface SUB1a of the first substrate SUB1 that protrudes from the second substrate SUB2 on one side in the first direction DR1. The signal connection line SGL may be disposed on a part of the upper surface SUB1a of the first substrate SUB1 that protrudes from the second substrate SUB2 on the side in the first direction DR1, on the first side surface SUB2s1 of the second substrate SUB2, and on the upper surface SUB2a of the second substrate SUB2.

One end of the chip-on film COF may overlap the pad electrode PE in the thickness direction, and the other end of the chip-on film COF may be disposed on the lower surface of the first substrate SUB1.

The second side surface SUB1s2 of the first substrate SUB1 and the second side surface SUB2s2 of the second substrate SUB2 are not aligned in the thickness direction, but the second side surface SUB2s2 of the second substrate SUB2 may protrude on the opposite side in the first direction DR1 from the second side surface SUB1s2 of the first substrate SUB1.

The part of the second substrate SUB2 of the second display device 11 that protrudes on the opposite side in the first direction DR1 from the first substrate SUB1 of the second display device 11 may overlap the pad electrode PE of the first display device 10 in the thickness direction.

The lower surface SUB2b of the second substrate SUB2 of the first display device 10 and the lower surface SUB2b of the second substrate SUB2 of the second display device 11 may not be located at a same level or may be located at different levels from each other.

In an embodiment, the lower surface SUB2b of the second substrate SUB2 of the second display device 11 may be higher than the lower surface SUB2b of the second substrate SUB2 of the first display device 10 by a predetermined height h. The predetermined height h may be equal to the sum of the thickness t1 of the pad electrode PE, the thickness t2 of an anisotropic conductive film ACF coupling the pad electrode PE with the chip-on film COF, and the thickness t3 of the chip-on film COF.

According to an embodiment, the first display device 10 and the second display device 11 are connected in the row direction in a way such that the pad area PA of the first display device 10 overlaps the display area DA of the second display device 11 in the thickness direction. In such an embodiment, the seam area SA between the display devices disposed adjacent to each other in the row direction may be generally reduced.

Hereinafter, a method of fabricating a tiled display according to an embodiment of the disclosure will be described. Hereinafter, the same or similar elements as those described above will be denoted by the same or similar reference numerals, and any repetitive detailed descriptions thereof will be omitted or simplified.

Figure 9:
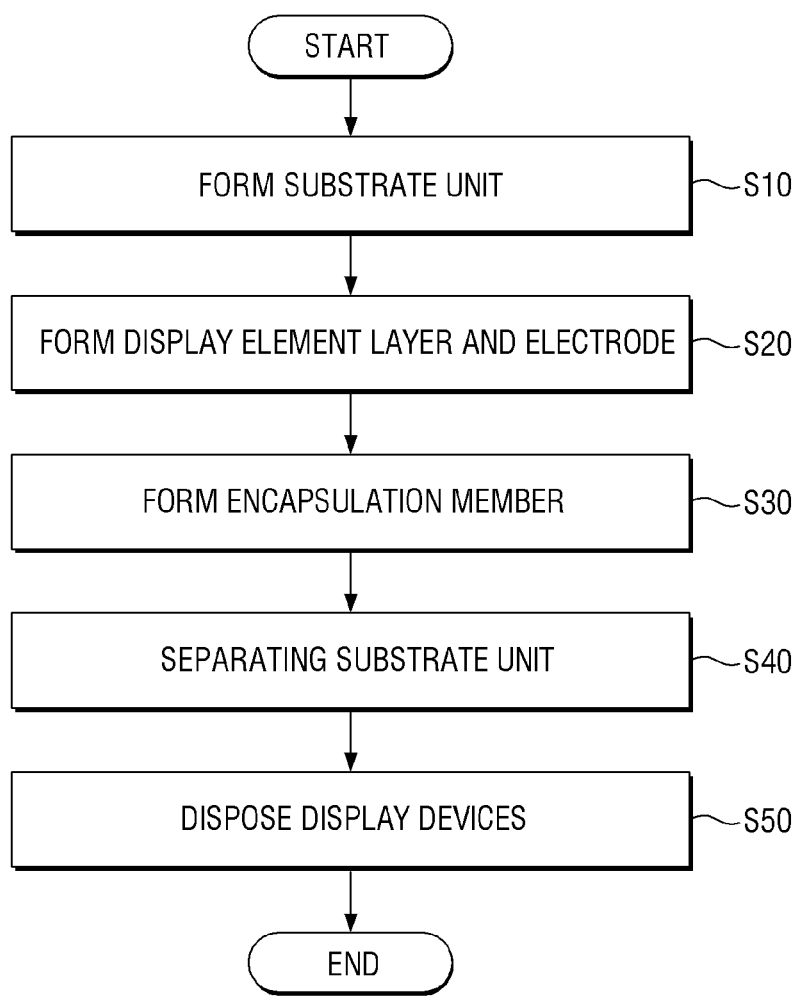
FIG. 9 is a flowchart for illustrating a method for fabricating a tiled display according to an embodiment of the disclosure.
Figure 10:
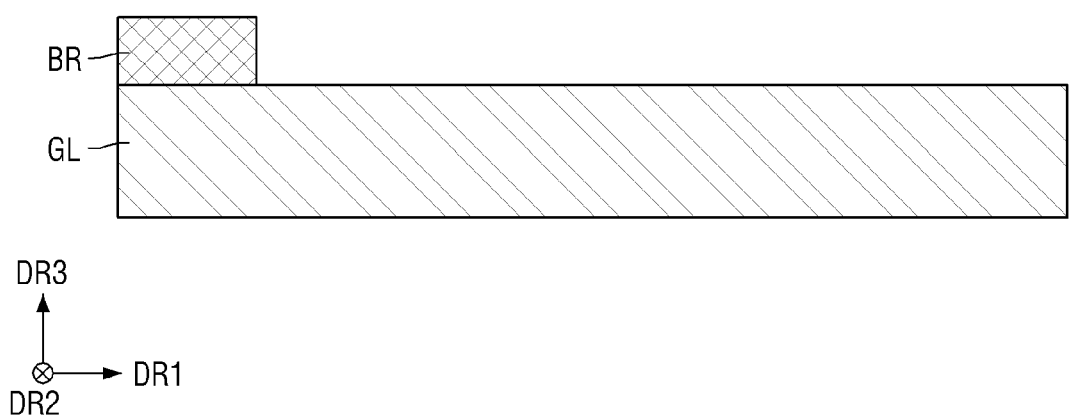
FIGS. 10 to 17 are cross-sectional views showing processes of a method of fabricating a tiled display according to an embodiment of the disclosure.
Figure 11:
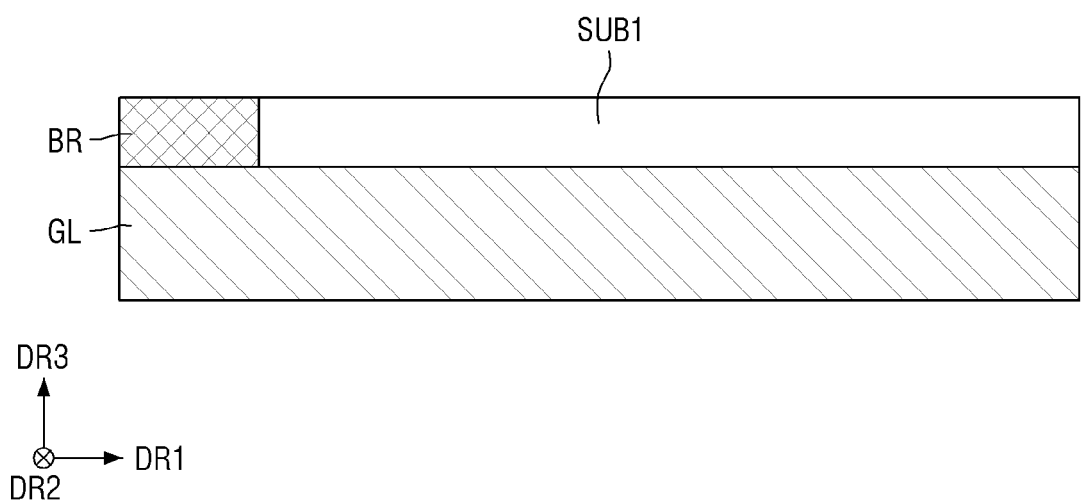
Figure 12:
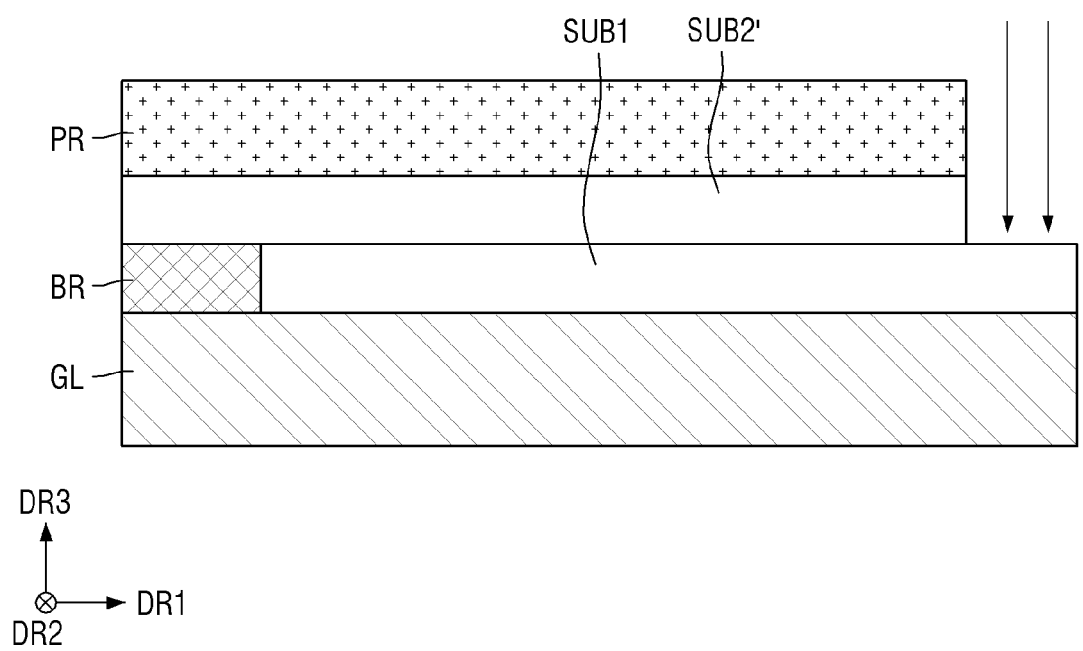
Figure 13:
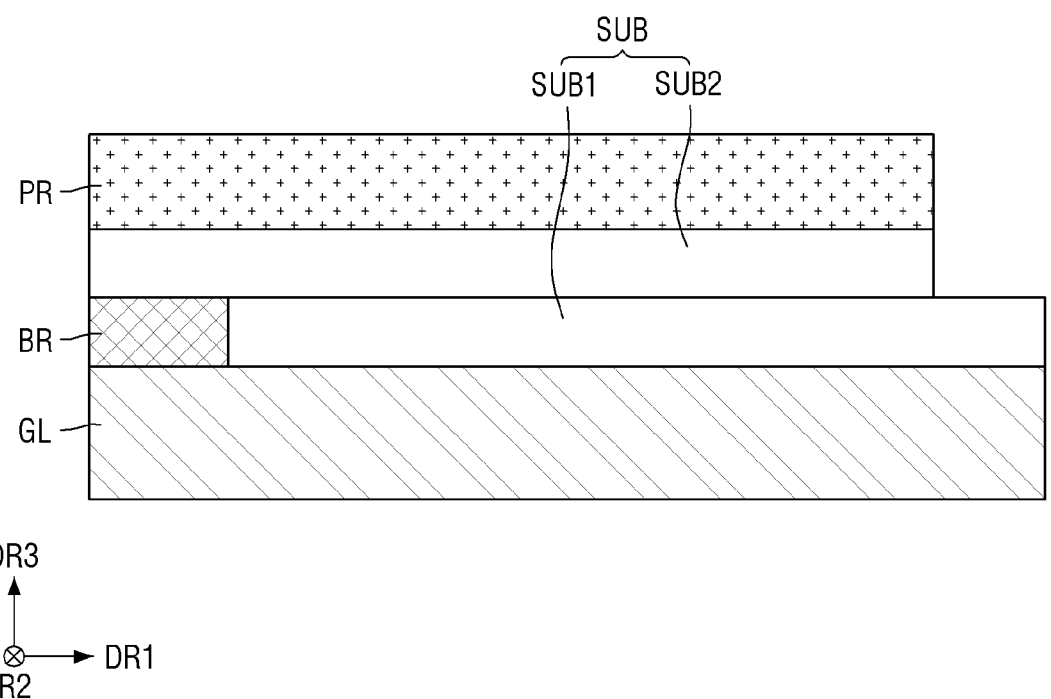

FIG. 9 is a flowchart for illustrating a method for fabricating a tiled display according to an embodiment of the disclosure. FIGS. 10 to 17 are cross-sectional views showing processes of a method of fabricating a tiled display according to an embodiment of the disclosure.

Referring to FIGS. 9 to 13 in conjunction with FIGS. 3 and 8, an embodiment of the method includes forming (or providing) a first substrate SUB1 and a second substrate SUB2 on the upper surface of a glass GL in a way such that a first side surface of the first substrate SUB1 protrudes from than a first side surface of the second substrate SUB2 on one side in the first direction DR1 (S10). The glass GL may include a light-transmitting material.

The providing or forming the substrates S10 may include disposing a light-transmitting barrier BR on an end portion of the upper surface of the glass; coating a first substrate material SUB1 on a remaining portion the upper surface of the glass GL exposed by the light-transmitting barrier BR; coating a second substrate material SUB2' on the upper surface of the light-transmitting barrier BR and the upper surface of the first substrate material SUB1; and performing a photomask lithography process using a photoresist PR disposed on the upper surface of the second substrate material SUB2' except the part overlapping the other end of the glass GL so that the first side surface of the first substrate SUB1 protrudes from the first side surface of the second substrate SUB2 on one side in the first direction DR1.

Figure 14:
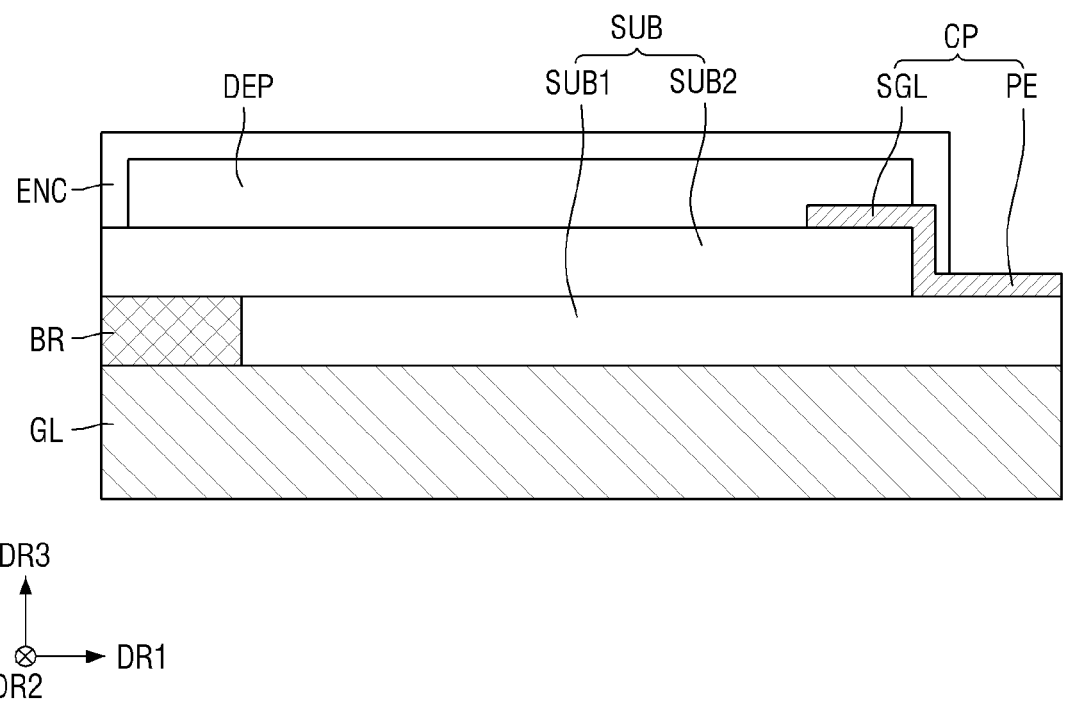

Referring to FIGS. 9 and 14, an embodiment of the method of fabricating the tiled display further includes providing or forming a display element layer DEP on the upper surface of the second substrate SUB2, and providing or forming a pad electrode PE on a part of the upper surface of the first substrate SUB1 that protrudes from the second substrate SUB2 on one side in the first direction DR1 (S20) after the forming the substrates S10.

The providing or forming the pad electrode PE may include providing or forming a conductive pattern CP. The conductive pattern CP may be formed on the upper surface of the second substrate SUB2, the first side surface of the first substrate SUB1, and the upper surface of the first substrate SUB1. The conductive pattern CP may include the pad electrode PE and a signal connection line SGL connecting the pad electrode PE with the display element layer DEP.

Subsequently, the method may include providing or forming an encapsulation member ENC for encapsulating the display element layer DEP (S30), as shown in FIG. 14.

Figure 15:
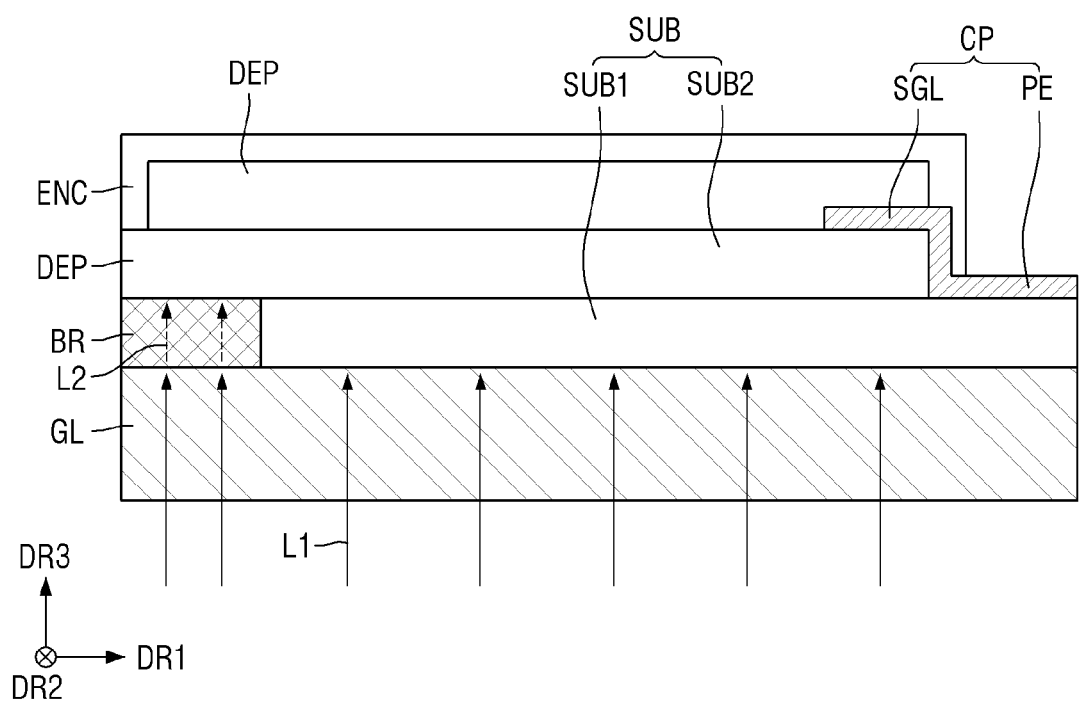
Figure 16:
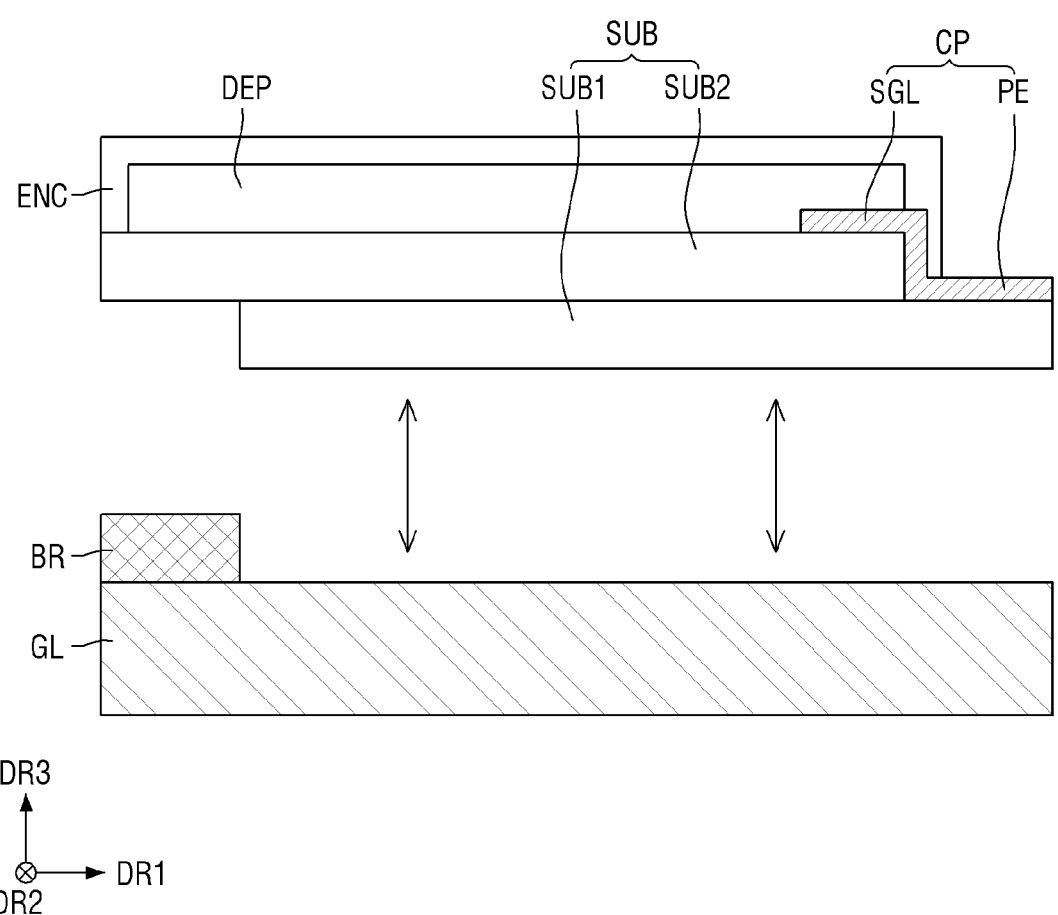

Subsequently, referring to FIGS. 9, 15 and 16, an embodiment of the method of fabricating the tiled display further includes separating the substrate unit SUB from the glass (S40).

The separating substrate unit SUB from the glass GL (S40) may include performing a laser lift off ("LLO") process of irradiating a laser L1 onto an interface between the glass GL and the first substrate SUB1. In an embodiment, as shown in FIG. 15, the laser L1 is focused on the interface between the glass GL and the first substrate SUB1 to weaken the adhesion between the first substrate SUB1 and the glass GL. In such an embodiment, the laser L1 may be focused on the interface between the glass GL and the first substrate SUB1 under the light-transmitting barrier BR and accordingly a part of the laser L1 (L2 in FIG. 15) may reach the interface between the light-transmitting barrier BR and the display element layer DEP. As a result, the adhesion between the light-transmitting barrier BR and the display element layer DEP may be weakened as well.

Accordingly, in the separating the substrate unit from the glass GL (S40), the glass GL and the light-transmitting barrier BR may be separated from each of the substrates SUB1 and SUB2.

In an embodiment, it is desired that the light-transmitting barrier BR includes a light-transmitting material like the glass GL to allow a part of the lasers L1 to reach the interface between the light-transmitting barrier BR and the display element layer DEP.

In such an embodiment, it is desired that the adhesion between the light-transmitting barrier BR and the glass GL is greater than the adhesion between the light-transmitting barrier BR and the display element layer DEP after the laser L1 is irradiated to separate the light-transmitting barrier BR from the display element layer DEP in the separating the substrate unit (S40).

Figure 17:
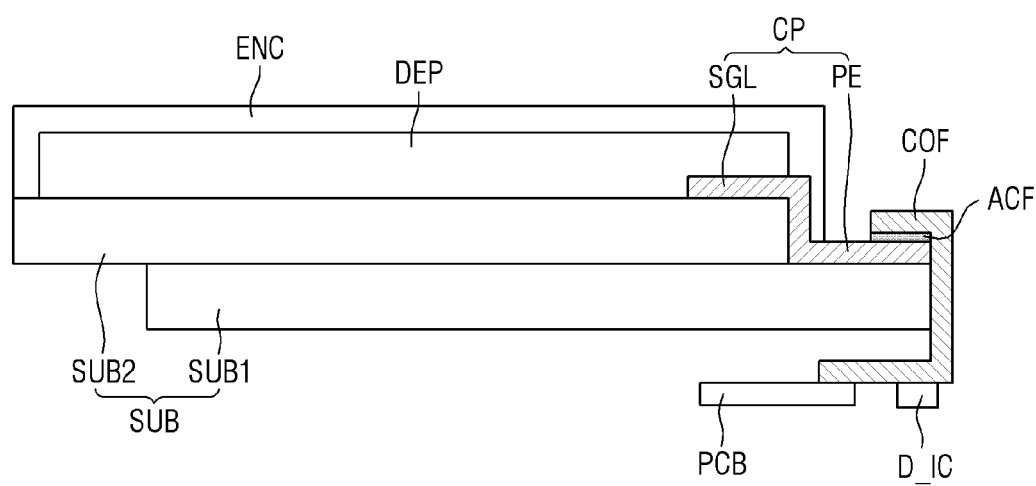
Figure 17:
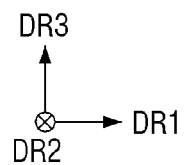

Subsequently, referring to FIG. 17, a chip-on film COF is attached by an anisotropic conductive film ACF, and a printed circuit board PCB is disposed at the other end of the chip-on film COF.

Subsequently, as shown in FIGS. 8 and 9, an embodiment of the method of fabricating the tiled display further includes disposing the second display device 11 fabricated via the above-described processes on the first display device 10 fabricated via the above-described processes in a way such that the second display device 11 overlaps the pad electrode PE of the first display device 10 (S50).

In the disposing the first and second display devices 10 and 11 (S50), the display area DA of the second display device 11 overlaps the pad electrode PE of the first display device 10, so that the seam area SA between the first display device 10 and the second display device 11 may be reduced.

Hereinafter, a tiled display according to an alternative embodiment of the disclosure will be described. Hereinafter, the same or similar elements as those described above will be denoted by the same or similar reference numerals, and any repetitive detailed descriptions thereof will be omitted or simplified.

Figure 18:
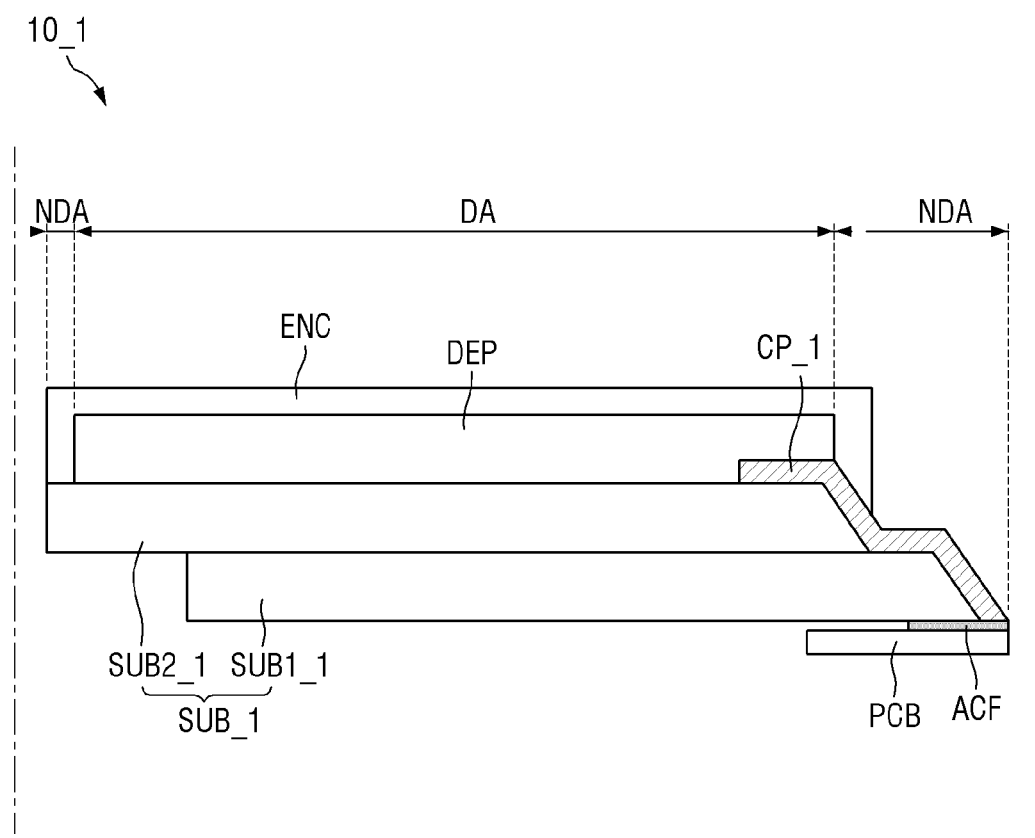
FIG. 18 is a cross-sectional view of a first display device of a tiled display according to an alternative embodiment of the disclosure.
Figure 19A:
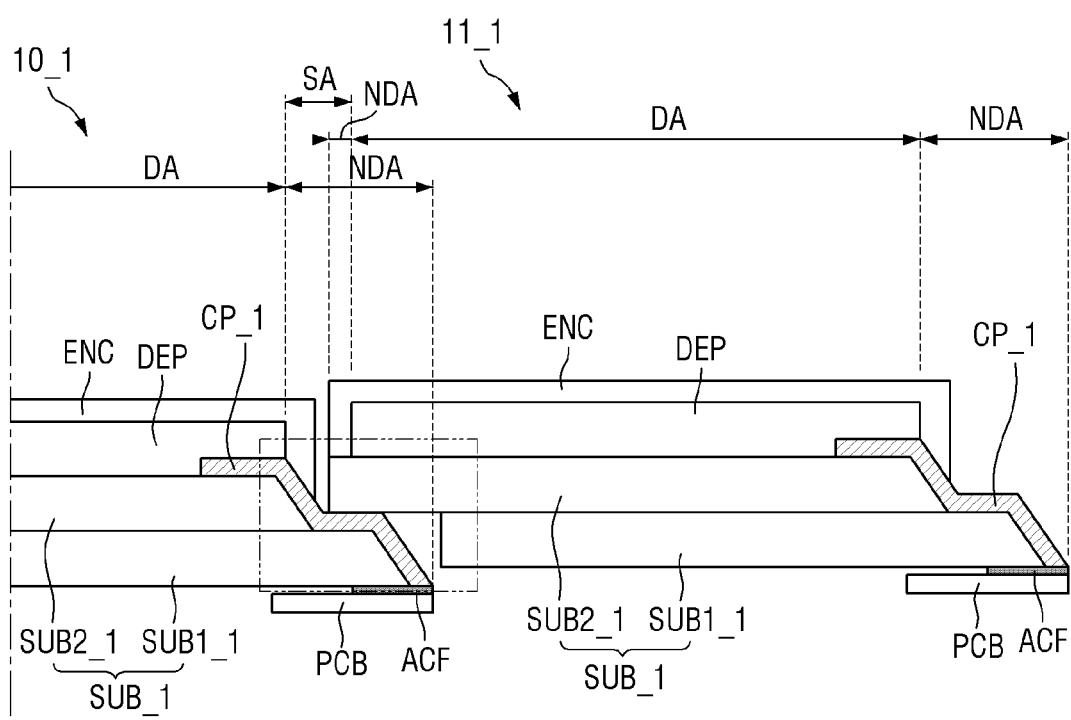
FIG. 19A is a cross-sectional view of a first display device and a second display device of the tiled display according to an embodiment of the disclosure.

FIG. 18 is a cross-sectional view of a first display device 10_1 of a tiled display according to an alternative embodiment of the disclosure. FIG. 19A is a cross-sectional view of a first display device 10_1 and a second display device 11_1 of the tiled display according to the embodiment of the disclosure, and FIG. 19B is an enlarged view of the encircled portion of FIG. 19A.

Figure 19B:
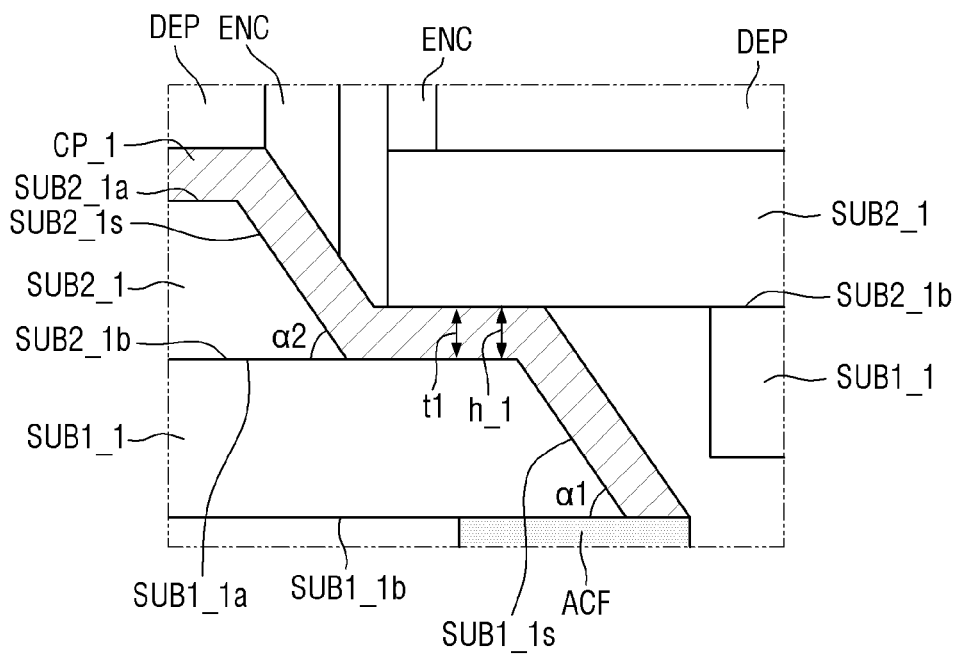
FIG. 19B is an enlarged view of the encircled portion of FIG. 19A.

The tiled display of FIGS. 18, 19A and 19B is different from the tiled display of FIGS. 3 and 8 in that a first side surface SUB1_1s of a first substrate SUB1_1 of a substrate unit SUB_1 and a first side surface SUB2_1s of a second substrate SUB2_1 of the substrate unit SUB_1 are inclined.

In such an embodiment, the first side surface SUB1_1s of the first substrate SUB1_1 may protrude from the first side surface SUB2_1s of the second substrate SUB2_1 on one side in the first direction DR1.

A conductive pattern CP_1 may be disposed on the first side surface SUB1_1s of the first substrate SUB1_1, a part of the upper surface SUB1_1a of the first substrate SUB1_1 that protrudes from the second substrate SUB2_1 on one side in the first direction DR1, the first side surface SUB2_1s of the second substrate SUB2_1, and the upper surface SUB2_1a of the second substrate SUB2_1.

According to an embodiment, as shown in FIGS. 19A and 19B, the first side surface SUB1_1s of the first substrate SUB1_1 of the substrate unit SUB_1 is inclined with respect to a lower surface SUB1_1b thereof and the first side surface SUB2_1s of the second substrate SUB2_1 of the substrate unit SUB_1 is inclined with respect to a lower surface SUB2_1b thereof, so that the conductive pattern CP_1 may be effectively prevented from being disconnected due to the side inclinations of the substrates SUB1_1 and SUB2_1 when the conductive pattern CP_1 is formed.

In such an embodiment, the inclination angle α1 of the first side surface SUB1_1s of the first substrate SUB1_1 and the inclination angle α2 of the first side surface SUB2_1s of the second substrate SUB2_1 may be equal to or less than about 60 degrees. In an embodiment, the inclination angle α1 of the first side surface SUB1_1s of the first substrate SUB1_1 and the inclination angle α2 of the first side surface SUB2_1s of the second substrate SUB2_1 may be inversely proportional to the lengths of the first side surface SUB1_1s of the first substrate SUB1_1 and the first side surface SUB2_1s of the second substrate SUB2_1. In such an embodiment, the inclination angle α1 of the first side surface SUB1_1s of the first substrate SUB1_1 and the inclination angle α2 of the first side surface SUB2_1s of the second substrate SUB2_1 may be equal to or greater than about 30 degrees.

In such an embodiment, the lower surface SUB2_1b of the second substrate SUB2_1 of the second display device 11_1 may be higher than the lower surface SUB2_1b of the second substrate SUB2_1 of the first display device 10_1 by a predetermined height h_1. The predetermined height h_1 may be equal to the thickness t1 of the conductive layer CP_1 such that an overall thickness of the tiled display may be reduced.

Figure 20:
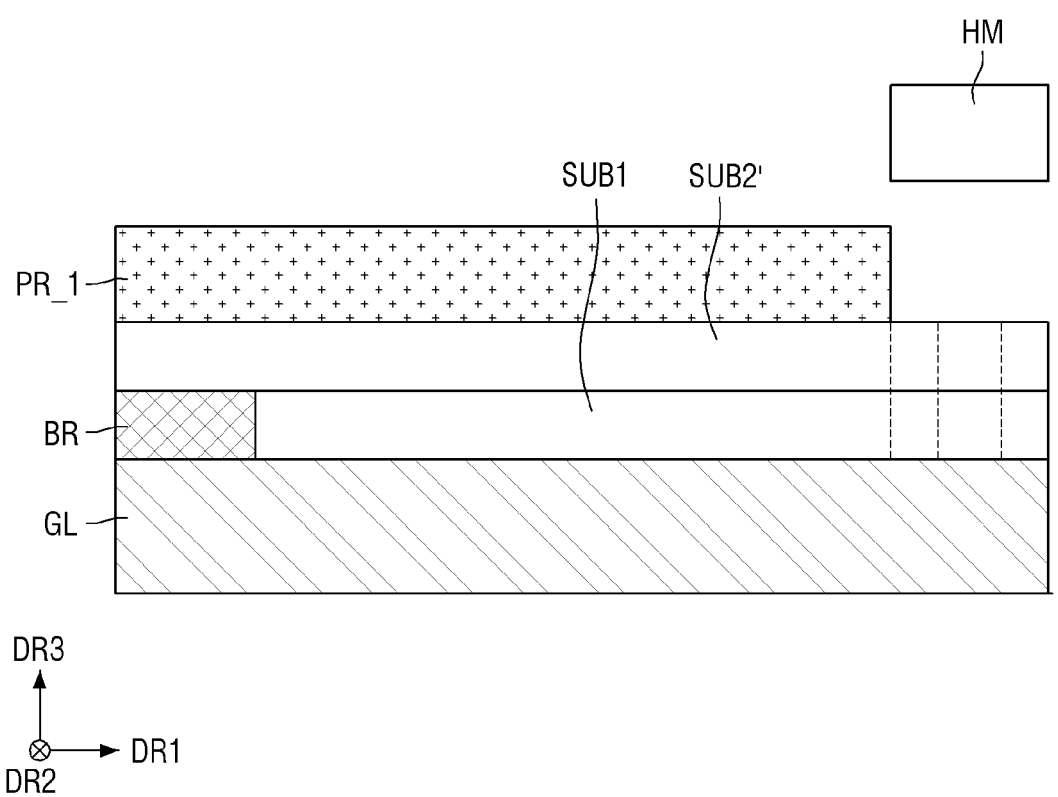
FIGS. 20 to 22 are cross-sectional views showing processes of a method of fabricating a tiled display according to an alternative embodiment of the disclosure.
Figure 21:
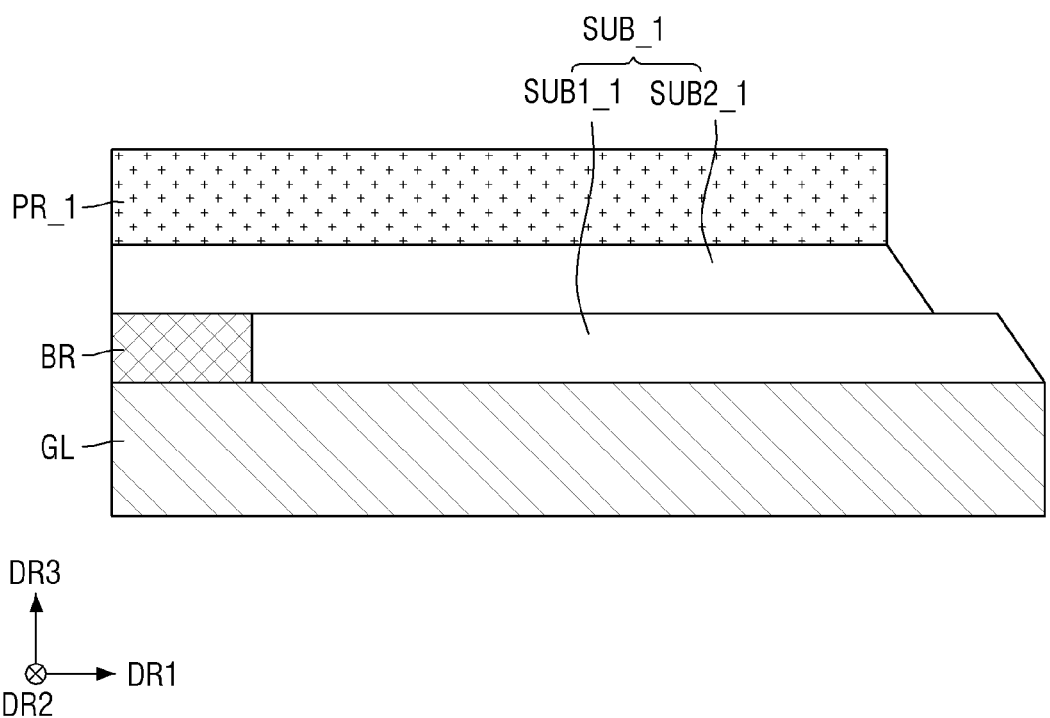
Figure 22:
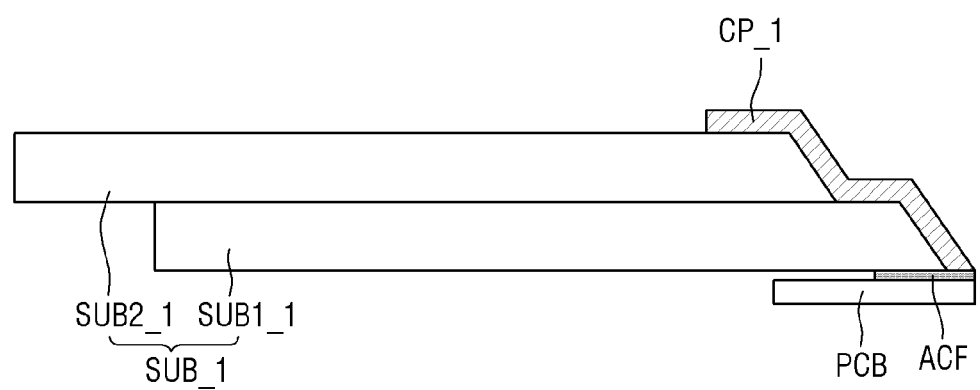

FIGS. 20 to 22 are cross-sectional views showing processes of a method of fabricating a tiled display according to another embodiment of the disclosure.

The embodiment of the method of FIGS. 20 to 22 in conjunction with FIGS. 18 and 19 is substantially the same as the embodiment of the method of FIGS. 9 to 17 except that the photomask lithography process described above with reference to FIGS. 12 and 13 is carried out by using a halftone mask to form the inclined first side surface of the first substrate and the inclined first side surface of the second substrate. In such an embodiment, a photoresist PR 1 is disposed on a second substrate material SUB2' formed on a first substrate material SUB1. The side surface of the photoresist PR 1 may be located more to the inside than the photoresist PR of FIG. 12. Subsequently, a halftone mask HM is placed above the second substrate material SUB2' exposed by the photoresist PR. By using the halftone mask HM, the amount of the transmitted light may be adjusted gradually so that the first side surface SUB2 is of the second substrate SUB2_1 and the first side surface SUB1_1s of the first substrate SUB1_1 of FIGS. 19A and 19B can be formed, while almost no light may transmit through the halftone mask HM to reach the upper surface SUB1_1a of the first substrate SUB1_1.

Subsequently, after the lithograph process using the halftone mask HM, the conductive pattern CP_1 is formed.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A tiled display comprising:
a plurality of display devices, wherein a display area and a non-display area surrounding the display area are defined in each of the plurality of display devices, and a pad area is defined in the non-display area,
wherein the plurality of display devices comprises a first display device and a second display device disposed adjacent to the first display device in a first direction,
wherein the pad area of the first display device overlaps the display area of the second display device in a thickness direction,
wherein each of the first display device and the second display device comprises a display element layer that is planar,
wherein the display element layer of the first display device at least partially overlaps the display element layer of the second display device along the first direction, and
wherein the first direction is perpendicular to the thickness direction,
wherein the first display device comprises a substrate unit disposed across the display area and the non-display area, the display element layer of the first display device being disposed on the substrate unit in the display area,
wherein the substrate unit comprises a first substrate and a second substrate disposed between the first substrate and the display element layer, and
wherein the first substrate of the first display device overlaps the display element layer of the second display device along the thickness direction and the second substrate of the first display device does not overlap the display element layer of the second display device along the thickness direction.

2. The tiled display of claim 1,
wherein the non-display area is located on each of one side and an opposite side of each of the plurality of display devices, which are opposite to each other in the first direction, and
wherein the non-display area located on the one side comprises the pad area, and a width of the non-display area located on the one side in the first direction is greater than a width of the non-display area located on the opposite side in the first direction.

3. The tiled display of claim 2,
wherein the first display device further comprises:
a sealing member disposed across the display area and the non-display area to seal the display element layer; and
a pad electrode disposed on the substrate unit in the pad area,
wherein a side surface of the first substrate and a side surface of the second substrate, which are on a same side as each other, are not aligned with each other in a thickness direction.

4. The tiled display of claim 3, wherein the side surface of the first substrate protrudes from the side surface of the second substrate in the first direction.

5. The tiled display of claim 4, wherein the pad electrode is disposed on a part of an upper surface of the first substrate protruding from the second substrate in the first direction.

6. The tiled display of claim 5,
wherein the first display device further comprises a signal connection line electrically connecting the pad electrode to the display element layer, and
wherein the signal connection line is disposed on the part of the upper surface of the first substrate protruding from the second substrate in the first direction, on the first side surface of the second substrate, and on an upper surface of the second substrate.

7. The tiled display of claim 3, wherein the first display device further comprises a chip-on film electrically connected to the pad electrode,
wherein a driver is disposed on the chip-on film,
wherein the chip-on film includes one end overlapping the pad electrode in the thickness direction and an opposite end disposed under the first substrate, and
wherein the first display device further comprises a printed circuit board connected to the opposite end of the chip-on film.

8. The tiled display of claim 1,
wherein the second display device comprises:
a substrate unit disposed across the display area and the non-display area, the display element layer of the second display device being on the substrate unit of the second display device disposed in the display area;
a sealing member disposed across the display area and the non-display area to seal the display element layer; and
a pad electrode disposed on the substrate unit in the pad area,
wherein the substrate unit of the second display device comprises a first substrate and a second substrate disposed between the first substrate of the second display device and the display element layer of the second display device,
wherein a side surface of the first substrate of the second display device and a side surface of the second substrate of the second display device, which are on a same side as each other, are not aligned with each other in a thickness direction, and
wherein the side surface of the second substrate of the second display device protrudes from the side surface of the first substrate of the second display device in the first direction.

9. The tiled display of claim 8, wherein a part of the second substrate of the second display device protruding from the first substrate of the second display device in the first direction overlaps the pad electrode of the first display device in the thickness direction.

10. The tiled display of claim 9,
wherein a lower surface of the second substrate of the first display device and a lower surface of the second substrate of the second display device are not located at a same level as each other, and
wherein the lower surface of the second substrate of the second display device is located higher than the lower surface of the second substrate of the first display device by a predetermined height.

11. The tiled display of claim 1, wherein the display element layer of the first display device and the display element layer of the second display device are spaced apart along the first direction.

12. A tiled display comprising:
a plurality of display devices, wherein a display area and a non-display area surrounding the display area are defined in each of the plurality of display devices,
wherein the plurality of display devices comprises a first display device and a second display device located adjacent to the first display device in a first direction,
wherein the non-display area is located on one side and an opposite side of each of the plurality of display devices, which are opposite to each other in the first direction,
wherein a width of the non-display area located on the one side in the first direction is greater than a width of the non-display area located on the opposite side in the first direction,
wherein the non-display area located on the one side of the first display device overlaps the display area of the second display device in a thickness direction,
wherein the first display device comprises:
a substrate unit disposed across the display area and the non-display area;
a display element layer disposed on the substrate unit in the display area;
a sealing member disposed across the display area and the non-display area to seal the display element layer; and
a conductive pattern disposed on the substrate unit in the non-display area located on the one side thereof,
wherein the substrate unit comprises a first substrate and a second substrate disposed between the first substrate and the display element layer,
wherein a side surface of the first substrate and a side surface of the second substrate, which are on a same side as each other, are not aligned with each other in the thickness direction,
wherein the side surface of the first substrate is inclined with respect to a lower surface of the first substrate, and the side surface of the second substrate is inclined with respect to a lower surface of the second substrate,
wherein the second display device comprises a display element layer,
wherein the display element layer of each of the first display device and the second display device is planar,
wherein the display element layer of the first display device at least partially overlaps the display element layer of the second display device along the first direction, and
wherein the first direction is perpendicular to the thickness direction, and wherein the first substrate of the first display device overlaps the display element layer of the second display device along the thickness direction and the second substrate of the first display device does not overlap the display element layer of the second display device along the thickness direction.

13. The tiled display of claim 12, wherein the side surface of the first substrate protrudes from the side surface of the second substrate in the first direction.

14. The tiled display of claim 13, wherein the conductive pattern is disposed on the side surface of the first substrate, on a part of an upper surface of the first substrate protruding from the second substrate in the first direction, on the side surface of the second substrate, and on an upper surface of the second substrate.

15. The tiled display of claim 14, wherein the first display device further comprises a printed circuit board electrically connected to the conductive pattern, and
wherein the printed circuit board is disposed under the first substrate.

16. The tiled display of claim 12, wherein the display element layer of the first display device and the display element layer of the second display device are spaced apart along the first direction.

17. A tiled display comprising:
a plurality of display devices, wherein a display area and a non-display area surrounding the display area are defined in each of the plurality of display devices,
wherein the plurality of display devices comprises a first display device and a second display device located adjacent to the first display device in a first direction,
wherein the non-display area is located on one side and an opposite side of each of the plurality of display devices, which are opposite to each other in the first direction,
wherein a width of the non-display area located on the one side in the first direction is greater than a width of the non-display area located on the opposite side in the first direction,
wherein the non-display area located on the one side of the first display device overlaps the display area of the second display device in a thickness direction,
wherein the first display device comprises:
a substrate unit disposed across the display area and the non-display area;
a display element layer disposed on the substrate unit in the display area;
a sealing member disposed across the display area and the non-display area to seal the display element layer; and
a conductive pattern disposed on the substrate unit in the non-display area located on the one side thereof,
wherein the substrate unit comprises a first substrate and a second substrate disposed between the first substrate and the display element layer,
wherein a side surface of the first substrate and a side surface of the second substrate, which are on a same side as each other, are not aligned with each other in the thickness direction,
wherein the side surface of the first substrate is inclined with respect to a lower surface of the first substrate, and the side surface of the second substrate is inclined with respect to a lower surface of the second substrate,
wherein the side surface of the first substrate protrudes from the side surface of the second substrate in the first direction,
wherein the conductive pattern is disposed on the side surface of the first substrate, on a part of an upper surface of the first substrate protruding from the second substrate in the first direction, on the side surface of the second substrate, and on an upper surface of the second substrate,
wherein the first display device further comprises a printed circuit board electrically connected to the conductive pattern,
wherein the printed circuit board is disposed under the first substrate, and
wherein an inclination angle of the side of the first substrate with respect to the lower surface of the first substrate and an inclination angle of a side of the second substrate with respect to the lower surface of the second substrate are in a range of about 30 degrees to about 60 degrees.

\* \* \* \* \*